(12) United States Patent
Chen et al.

(10) Patent No.: US 10,985,316 B2
(45) Date of Patent: Apr. 20, 2021

(54) BOTTOM ELECTRODE STRUCTURE IN MEMORY DEVICE

(71) Applicant: Taiwan Semiconductor Manufacturing Co., Ltd., Hsin-Chu (TW)

(72) Inventors: Chao-Yang Chen, Hsin-Chu (TW); Chun-Yang Tsai, Hsinchu (TW); Kuo-Ching Huang, Hsinchu (TW); Wen-Ting Chu, Kaohsiung (TW); Pili Huang, Hsin-Chu (TW); Cheng-Jun Wu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/359,092

(22) Filed: Mar. 20, 2019

(65) Prior Publication Data

US 2020/0106011 A1  Apr. 2, 2020

Related U.S. Application Data

(60) Provisional application No. 62/737,317, filed on Sep. 27, 2018.

(51) Int. Cl.
*H01L 27/088* (2006.01)
*H01L 21/8236* (2006.01)
(Continued)

(52) U.S. Cl.
CPC ...... *H01L 45/1253* (2013.01); *H01L 27/2481* (2013.01); *H01L 45/08* (2013.01); *H01L 45/1233* (2013.01); *H01L 45/1608* (2013.01)

(58) Field of Classification Search
CPC ............. H01L 45/1233; H01L 27/2481
(Continued)

(56) References Cited

U.S. PATENT DOCUMENTS 8,362,454 B2 * 1/2013 Lee .................. H01L 45/08
257/3
9,025,360 B2 * 5/2015 Pramanik ............ H01L 45/144
365/148

(Continued)

OTHER PUBLICATIONS

Allerd, A. L. "Electronegativity Values From Thermochemical Data." J. Inorg, Nucl. Chem., 1961, vol. 17, pp. 215-221.
(Continued)

*Primary Examiner* — Calvin Lee
(74) *Attorney, Agent, or Firm* — Eschweiler & Potashnik, LLC

(57) ABSTRACT

In some embodiments, the present disclosure relates to an integrated chip. The integrated chip includes one or more lower interconnect layers arranged within a dielectric structure over a substrate. A bottom electrode is disposed over one of the one or more lower interconnect layers. A lower surface of the bottom electrode includes a material having a first electronegativity. A data storage layer separates the bottom electrode from a top electrode. A reactivity reducing layer contacts the lower surface of the bottom electrode. The reactivity reducing layer has a second electronegativity that is greater than or equal to the first electronegativity.

20 Claims, 13 Drawing Sheets

(51) Int. Cl.
*H01L 45/00* (2006.01)
*H01L 27/24* (2006.01)

(58) Field of Classification Search
USPC .......................................... 438/277; 257/401
See application file for complete search history.

(56) References Cited

U.S. PATENT DOCUMENTS

| | | | |
|---|---|---|---|
| 9,129,894 B2* | 9/2015 | Hashim | G11C 13/0007 |
| 9,142,762 B1* | 9/2015 | Li | H01L 43/12 |
| 9,379,322 B2* | 6/2016 | Huang | H01L 45/085 |
| 10,475,999 B2 | 11/2019 | Chang et al. | |
| 2015/0295172 A1 | 10/2015 | Sung et al. | |
| 2016/0276586 A1 | 9/2016 | Trinh et al. | |
| 2018/0006215 A1 | 1/2018 | Jeong et al. | |

OTHER PUBLICATIONS

Huheey, James. "Inorganic Chemistry: Principles of Structure & Reactivity." Fourth Edition, published in 1993. ISBN: 0-06-042995-X.

Chiu et al. "Differential 2R Crosspoint RRAM for Memory System in Mobile Electronics With Zero Standby Current." EEGS, UC Berkeley, May 6, 2013.

Leti. "Leti Clarifies Correlation Between Endurance, Window Margin and Retention in RRAM for First Time." Signal Integrity Journal. Published on Dec. 6, 2016. Retrieved online on Sep. 22, 2018 from www.signalintegrityjournal.com/articles/243-leti-clarifies-correlation-between-endurance-window-margin-and-retention-in-rram-forfirst-time.

* cited by examiner

BOTTOM ELECTRODE STRUCTURE IN MEMORY DEVICE

REFERENCE TO RELATED APPLICATION

This application claims the benefit of U.S. Provisional Application No. 62/737,317, filed on Sep. 27, 2018, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random-access memory (RRAM) devices are one promising candidate for a next generation non-volatile memory technology. This is because RRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
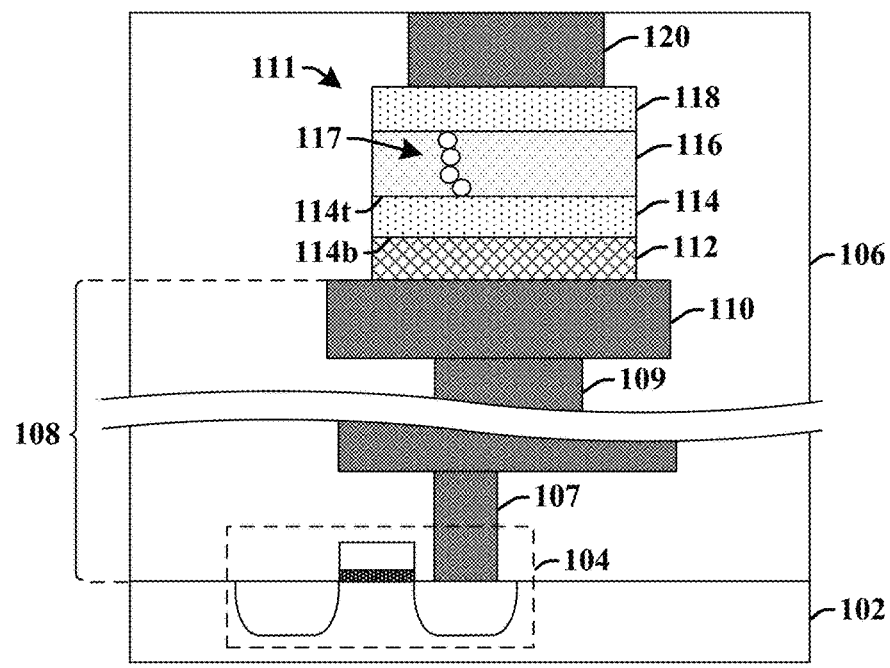
FIG. 1 illustrates a cross-sectional view of some embodiments of an integrated chip having a resistive random-access memory (RRAM) device comprising a bottom electrode over a reactivity reducing layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a data storage layer (e.g., a layer of high-k dielectric material) arranged between conductive bottom and top electrodes disposed within a back-end-of-the-line (BEOL) interconnect stack. RRAM devices are configured to operate based upon a process of reversible switching between resistive states. This reversible switching is enabled by selectively forming a conductive filament through the data storage layer. For example, the data storage layer, which is normally insulating, can be made to conduct by applying a voltage across the conductive electrodes to form a conductive filament extending through the data storage layer. An RRAM device having a first (e.g., high) resistive state corresponds to a first data value (e.g., a logical '0') and an RRAM device having a second (e.g., low) resistive state corresponds to a second data value (e.g., a logical '1').

RRAM devices are strong candidates to replace existing non-volatile memory (NVM) devices (e.g., flash) because of their high density, high speed, good endurance, and compatibility with CMOS processes. However, forming RRAM devices to have good reliability (e.g., sufficient cycling and stable data retention) is a challenge for integrated chip manufacturers. It has been appreciated that the reliability of RRAM devices (e.g., cycling and data retention) is correlated to a reactivity of the bottom electrode with oxygen in the data storage layer. For example, a bottom electrode with a low reactivity to oxygen will offer a relatively good reliability, while a bottom electrode with a high reactivity to oxygen will provide for a relatively poor reliability. It has also been appreciated that the reactivity of the bottom electrode with oxygen can be influenced by both a material of the bottom electrode and a material directly under the bottom electrode.

The present disclosure, in some embodiments, relates to an integrated chip comprising an RRAM device having a bottom electrode over a reactivity reducing layer that is configured to reduce a reactivity of the bottom electrode with oxygen. The integrated chip comprises an RRAM device having a bottom electrode disposed over one or more lower interconnect layers. A lower surface of the bottom electrode comprises a material that has a first electronegativity. A data storage layer separates the bottom electrode from a top electrode. A reactivity reducing layer contacts the lower surface of the bottom electrode and has a second electronegativity that is greater than or equal to the first electronegativity. The electronegativity of the reactivity reducing layer reduces a reactivity of the bottom electrode to oxygen within the data storage layer, and thereby improves a reliability (e.g., data cycling and/or data retention) of the RRAM device.

FIG. 1 illustrates a cross-sectional view of some embodiments of an integrated chip 100 comprising a resistive random-access memory (RRAM) device over a reactivity reducing layer.

The integrated chip 100 comprises an RRAM device 111 disposed within a dielectric structure 106 over a substrate 102. The RRAM device 111 is separated from the substrate 102 by one or more lower interconnect layers 108 disposed within the dielectric structure 106. In some embodiments, the one or more lower interconnect layers 108 may comprise a conductive contact 107 coupled to overlying and alternating layers of interconnect vias 109 and interconnect wires 110. The one or more lower interconnect layers 108 are configured to couple the RRAM device 111 to an access device 104 arranged within the substrate 102. In some embodiments, the access device may comprise a transistor device (e.g., a MOSFET, a bi-polar junction transistor (BJT), a high electron mobility transistor (HEMT), or the like).

The RRAM device 111 comprises a data storage layer 116 arranged between a bottom electrode 114 and a top electrode 118. The bottom electrode 114 is coupled to the one or more lower interconnect layers 108 and the top electrode 118 is coupled to an upper interconnect structure 120 comprising an interconnect wire or via. The data storage layer 116 is configured to store data states by undergoing reversible changes between a high resistive state associated with a first data state (e.g., a '0') and a low resistive state associated with a second data state (e.g., a '1'). For example, during operation, to achieve a low resistive state within the data storage layer 116, a first set of bias conditions may be applied to the bottom electrode 114 and the top electrode 118. The first set of bias conditions drive oxygen from data storage layer 116 to the top electrode 118, thereby forming a conductive filament 117 of oxygen vacancies across the data storage layer 116. Alternatively, to achieve a high resistive state within the data storage layer 116, a second set of bias conditions may be applied to the bottom electrode 114 and the top electrode 118. The second set of bias conditions breaks the conductive filament 117 by driving oxygen from the top electrode 118 to the data storage layer 116.

The bottom electrode 114 comprises a lower surface 114b and a top surface 114t. The lower surface 114b comprises a material that has a first electronegativity. In some embodiments, the material continuously extends between the lower surface 114b and the top surface 114t. A reactivity reducing layer 112 contacts the lower surface 114b of the bottom electrode 114. The reactivity reducing layer 112 has a second electronegativity that is greater than or equal to the first electronegativity. For example, in some embodiments, the material of the bottom electrode 114 may have a first electronegativity of 1.5 and the reactivity reducing layer 112 may have a second electronegativity that is greater than or equal to 1.5. The electronegativity of the reactivity reducing layer 112 decreases a reactivity of the bottom electrode 114 to oxygen within the data storage layer 116. By decreasing a reactivity of the bottom electrode 114 to oxygen, a reliability of the RRAM device 111 is improved thereby increasing data retention time and a number of read/write cycles without error.

Figure 2A:
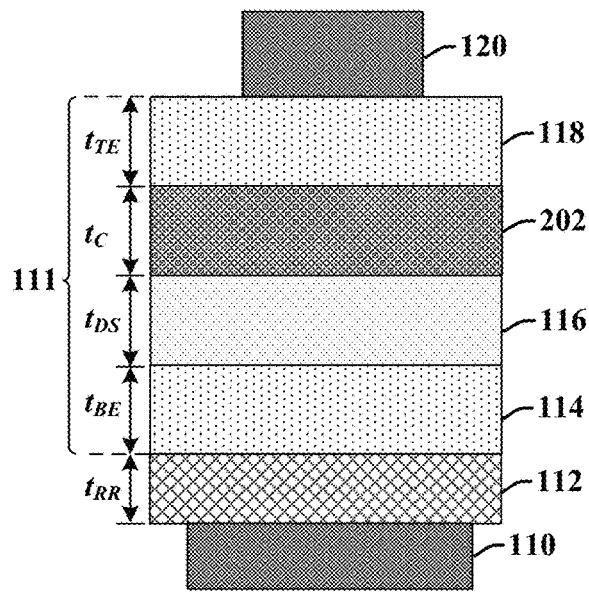
FIGS. 2A-2C illustrate cross-sectional views of some additional embodiments of an RRAM device comprising a bottom electrode over a reactivity reducing layer.
Figure 2B:
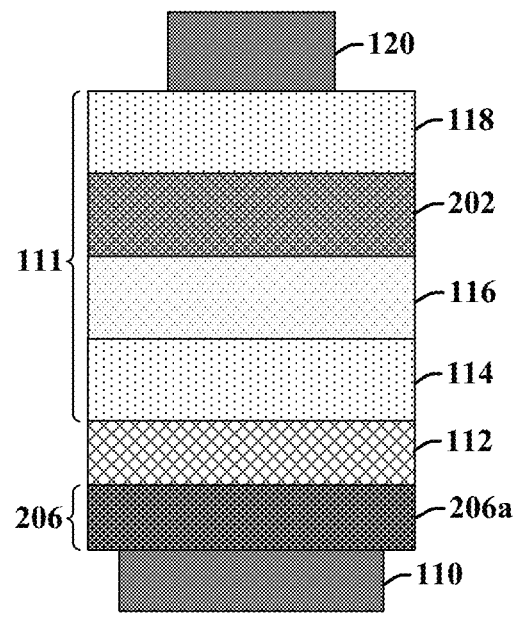
Figure 2C:
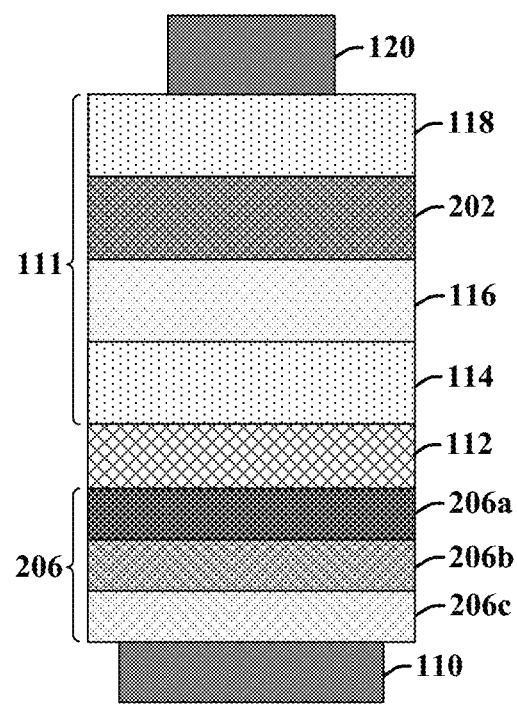

FIGS. 2A-2C illustrate cross-sectional views of some additional embodiments of an RRAM device over a reactivity reducing layer.

As shown in cross-sectional view 200 of FIG. 2A, the RRAM device 111 comprises a bottom electrode 114 separated from a top electrode 118 by way of a data storage layer 116. In some embodiments, a capping layer 202 is arranged between the data storage layer 116 and the top electrode 118. The capping layer 202 is configured to store oxygen, which can facilitate resistive changes within the data storage layer 116.

In some embodiments, the top electrode 118 may comprise a metal, a metal-nitride, or doped polysilicon. For example, in various embodiments, the top electrode 118 may comprise aluminum, titanium, tantalum, gold, platinum, tungsten, nickel, iridium, titanium-nitride, tantalum-nitride, n-type doped polysilicon, p-type doped polysilicon, or the like. In some embodiments, the top electrode 118 may have a thickness $t_{TE}$ in a range of between approximately 0 nm (nanometers) and approximately 500 nm. In some additional embodiments, the top electrode 118 may have a thickness $t_{TE}$ in a range of between approximately 50 Angstroms and approximately 200 Angstroms.

In some embodiments, the capping layer 202 may comprise a metal or a metal-oxide. For example, in some embodiments, the capping layer 202 may comprise hafnium, titanium, tantalum, aluminum, zirconium, or the like. In other embodiments, the capping layer 202 may comprise hafnium-oxide, titanium-oxide, zirconium-oxide, cesium-oxide, germanium-oxide, or the like. In some embodiments, the capping layer 202 may have a thickness $T_C$ in a range of between approximately 0 nm and approximately 500 nm. In some embodiments, the capping layer 202 may have a thickness $T_C$ in a range of between approximately 70 Angstroms and approximately 200 Angstroms.

In some embodiments, the data storage layer 116 may comprise a metal, a metal-oxynitride, or a compound-metal-oxide. For example, in various embodiments, the data storage layer 116 may comprise titanium-dioxide ($TiO_2$), hafnium-dioxide ($HfO_2$), hafnium-aluminum-dioxide ($Hf_xAl_{1-x}O_2$), tantalum-pentoxide ($Ta_2O_5$), hafnium-tantalum-dioxide ($Hf_xTa_{1-x}O_2$), tungsten-dioxide ($WO_2$), zirconium-dioxide ($ZrO_2$), aluminum-dioxide ($Al_2O_3$), strontium-oxide (StO), silicon dioxide ($SiO_2$), or the like. In some embodiments, the data storage layer 116 may have a thickness $t_{DS}$ in a range of between approximately 1 nm and approximately 100 nm. In some additional embodiments, the data storage layer 116 may have a thickness in a range of between approximately 30 Angstroms and approximately 100 Angstroms.

In some embodiments, a lower surface (e.g., a bottom surface) of the bottom electrode 114 may comprise a material including a metal, a metal-nitride, a metal oxide, doped polysilicon, or the like. For example, in some embodiments the material may comprise aluminum, titanium, tantalum, tungsten, nickel, titanium-nitride, tantalum-nitride, iridium oxide, n-type doped polysilicon, p-type doped polysilicon, or the like. In some embodiments, the material may comprise a noble metal (i.e., an inert metal), such as rhenium, ruthenium, rhodium, palladium, silver, osmium, iridium, platinum, or gold. In some embodiments, the entirety of the bottom electrode 114 may be the material. In some embodiments, the bottom electrode 114 may have a thickness $T_{BE}$ in a range of between approximately 1 nm and approximately 200 nm.

A reactivity reducing layer 112 contacts the lower surface (e.g., a bottom surface) of the bottom electrode 114. In some embodiments, the reactivity reducing layer 112 comprises a metal, a metal-nitride, a metal oxide, doped polysilicon, or the like. For example, in various embodiments, the reactivity reducing layer 112 may comprise aluminum, titanium, tantalum, gold, platinum, tungsten, nickel iridium, titanium-nitride, tantalum-nitride, iridium-oxide, n-type doped polysilicon, p-type doped polysilicon, or the like. In some embodiments, the bottom electrode 114 and the reactivity reducing layer 112 are different materials. In some embodiments, the reactivity reducing layer 112 and the one or more lower interconnect layers 108 are different materials. In some embodiments, the reactivity reducing layer 112 is not copper. The reactivity reducing layer 112 may have a thickness $T_{RR}$ in a range of between approximately 1 nm and approximately 200 nm. In some additional embodiments, the reactivity reducing layer 112 may have a thickness $T_{RR}$ in a range of between approximately 5 nm and approximately 20 nm.

In some embodiments, the reactivity reducing layer 112 has a first electronegativity and the material along the lower surface of the bottom electrode 114 has a second electronegativity that is less than or equal to the first electronegativity. A material of the reactivity reducing layer 112 with the first electronegativity contacts the material of the bottom electrode 114 with a second electronegativity along an interface. The electronegativity of the reactivity reducing layer 112 decreases a reactivity of the bottom electrode 114 to oxygen within the data storage layer 116. For example, if the reactivity reducing layer 112 has a larger electronegativity than the material along the lower surface of the bottom electrode 114, bonding electrons of the bottom electrode 114 and the reactivity reducing layer 112 may be drawn towards the reactivity reducing layer 112. Drawing the bonding electrons towards the reactivity reducing layer 112 may reduce an ability of the bottom electrode 114 to react with oxygen in the data storage layer 116, thereby increasing a reliability of the RRAM device 111.

In some embodiments, the first electronegativity of the reactivity reducing layer 112 is greater than or equal to approximately 1.5. In some additional embodiments, the first electronegativity may be greater than approximately 1.9 to decrease a reactivity of the bottom electrode 114. In some additional embodiments, the first electronegativity may be greater than approximately 2.2 to decrease a reactivity of the bottom electrode 114. In some embodiments, the second electronegativity may be approximately equal to 1.5. In other embodiments, the second electronegativity may be greater than 1.5. For example, in some embodiments, the second electronegativity may be greater than approximately 2.0. In some embodiments, a difference between the first electronegativity and the second electronegativity is greater than approximately 0.1. In other embodiments, a difference between the first electronegativity and the second electronegativity is greater than approximately 0.2.

As shown in cross-sectional views 204 and 208 of FIGS. 2B-2C, in some embodiments one or more additional materials 206 may be disposed below the reactivity reducing layer 112. In some embodiments, the one or more additional materials 206 may be disposed between the reactivity reducing layer 112 and a closest underlying (e.g., immediately underlying) one of the interconnect wires 110 (e.g., an immediately underlying copper interconnect wire). In some embodiments, the one or more additional materials 206 may comprise a bottom electrode diffusion barrier, a liner, a conductive layer, and/or the like. In some embodiments, the one or more additional materials 206 may comprise a different material than the reactivity reducing layer 112. In some embodiments, the one or more additional materials 206 may have electronegativities that are smaller than the reactivity reducing layer 112. For example, in some embodiments, the reactivity reducing layer 112 may comprise an electronegativity of approximately 2.5 and may contact one of the one or more additional materials 206 having an electronegativity of less than 2.5. In other embodiments, the one or more additional materials 206 may have electronegativities that are larger than the reactivity reducing layer 112.

In some embodiments, shown in cross-sectional view 204 of FIG. 2B, the one or more additional materials 206 may comprise a first additional material 206a contacting the lower surface of the reactivity reducing layer 112. In some such embodiments, the first additional material 206a may comprise a metal, a metal-nitride, a metal-oxide, doped polysilicon, or the like. For example, the first additional material 206a may comprise aluminum, titanium, tantalum, tungsten, gold, platinum, nickel, iridium, titanium-nitride, tantalum-nitride, iridium oxide, n-type doped polysilicon, or p-type doped polysilicon.

In some additional embodiments, shown in cross-sectional view 208 of FIG. 2C, the one or more additional materials 206 may comprise a plurality of additional materials. For example, the one or more additional materials 206 may comprise a first additional material 206a contacting a lower surface of the reactivity reducing layer 112, a second additional material 206b contacting a lower surface of the first additional material 206a, and a third additional material 206c contacting a lower surface of the second additional material 206b. In some embodiments, the first additional material 206a, the second additional material 206b, and/or the third additional material 206c may comprise a metal (e.g., aluminum, titanium, tantalum, tungsten, gold, platinum, nickel, iridium), a metal-nitride (e.g., titanium-nitride, tantalum-nitride), a metal-oxide (e.g., iridium oxide), doped polysilicon (e.g., n-type doped polysilicon, or p-type doped polysilicon), or the like. In some embodiments, the first additional material 206a, the second additional material 206b, and/or the third additional material 206c may comprise different materials. For example, the first additional material 206a may include titanium, the second additional material 206b including an oxide (e.g., tantalum oxide), and the third additional material 206c may include cobalt. In some additional embodiments (not shown), the one or more additional materials 206 may comprise further materials (e.g., a fifth additional material, a sixth additional material, etc.).

Figure 3:
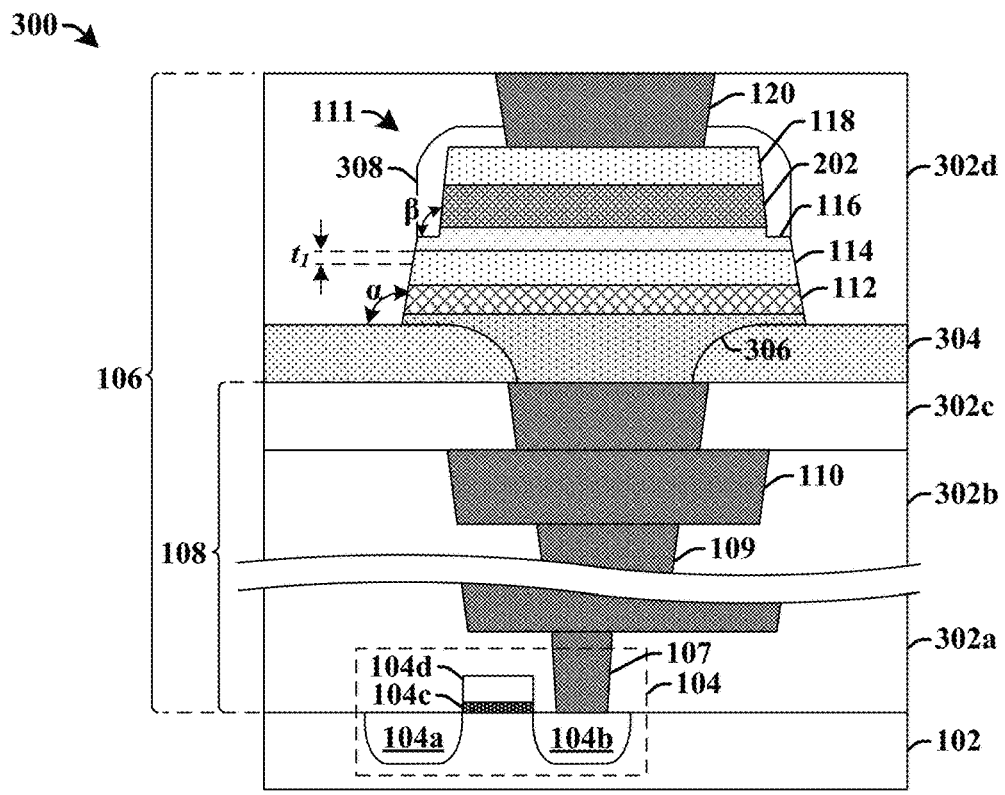
FIGS. 3-7 illustrate cross-sectional views of some additional embodiments of an integrated chip having an RRAM device over a reactivity reducing layer.

FIG. 3 illustrates an additional embodiment of a cross-sectional view of an integrated chip 300 having an RRAM device over a reactivity reducing layer.

The integrated chip 300 comprises an RRAM device 111 disposed within a dielectric structure 106 arranged over a substrate 102. In some embodiments, the dielectric structure 106 comprises a plurality of stacked inter-level dielectric (ILD) layers 302a-302d. The plurality of stacked ILD layers 302a-302d comprise one or more lower ILD layers 302a-302c that laterally surround one or more lower interconnect layers 108 comprising conductive contacts 107, interconnect vias 109, and interconnect wires 110. In some embodiments, the plurality of stacked ILD layers 302a-302d may comprise one or more of silicon dioxide, SiCOH, a fluorosilicate glass, a phosphate glass (e.g., borophosphate silicate glass), or the like. The one or more lower interconnect layers 108 are configured to couple the RRAM device 111 to an access device 104 arranged within the substrate 102. In some embodiments, the access device 104 may comprise a MOSFET device having a gate electrode 104d that is laterally arranged between a source region 104a and a drain region 104b and that is vertically separated from the substrate 102 by a gate dielectric 104c.

The RRAM device 111 comprises a data storage layer 116 arranged between a bottom electrode 114 and a top electrode 118. The bottom electrode 114 is arranged over the one or more lower interconnect layers 108. In some embodiments, a lower insulating layer 304 may be disposed over the one or more lower ILD layers 302a-302c. The lower insulating layer 304 comprises sidewalls defining an opening that is between the bottom electrode 114 and the one or more lower interconnect layers 108. In various embodiments, the lower insulating layer 304 may comprise silicon nitride, silicon dioxide, silicon carbide, or the like. In some embodiments, a bottom electrode diffusion barrier 306 is arranged between sidewalls of the lower insulating layer 304. The bottom electrode diffusion barrier 306 may have a substantially flat upper surface that overlies the lower insulating layer 304. In some embodiments, the bottom electrode diffusion barrier 306 may comprise titanium nitride, tantalum nitride, or the like.

A reactivity reducing layer 112 is disposed over the bottom electrode diffusion barrier 306. In some embodiments, the bottom electrode diffusion barrier 306 is arranged between the reactivity reducing layer 112 and the one or more lower interconnect layers 108. The reactivity reducing layer 112 continuously extends from a top of the bottom electrode diffusion barrier 306 to contact a lower surface of the bottom electrode 114. In some embodiments, the reactivity reducing layer 112 has a bottommost surface that is completely over a topmost surface of the lower insulating layer 304. In some embodiments, the reactivity reducing layer 112 has sidewalls that are aligned along a line with sidewalls of the bottom electrode 114 and the bottom electrode diffusion barrier 306.

In some embodiments, the data storage layer 116 may have a bottom surface having a first width and a top surface having a second width that is less than the first width. In such embodiments, the data storage layer 116 may have a lower sidewall coupled to an upper sidewall by a horizontally extending surface that overlies the data storage layer 116. In some embodiments, the lower sidewall may be aligned along a first line with a sidewall of the bottom electrode 114 and the upper sidewall may be aligned along a second line with a sidewall of the top electrode 118.

In some embodiments, sidewalls of the reactivity reducing layer 112 may be oriented at a first angle α with respect to an upper surface of the lower insulating layer 304. The first angle α may be greater than 90°. In some embodiments, the sidewalls of the reactivity reducing layer 112 may be aligned along a line with sidewalls of the bottom electrode 114 and the data storage layer 116. In some embodiments, the sidewalls of the capping layer 202 may be oriented at a second angle β with respect to a horizontal plane extending along an upper surface of the data storage layer 116. The second angle β may also be greater than 90°. In some embodiments, the first angle α is different (e.g., greater than) the second angle β.

In some embodiments, sidewall spacers 308 may be arranged along sidewalls of the capping layer 202 and the top electrode 118. In some embodiments, the sidewall spacers 308 may also be arranged along a sidewall of the data storage layer 116. In some embodiments, the sidewall spacers 308 may be arranged on a horizontally extending surface of the top electrode 118 and/or the data storage layer 116. In some embodiments, the sidewall spacers 308 may comprise a nitride (e.g., silicon nitride), an oxide (e.g., silicon oxide), a carbide (e.g., silicon carbide), or the like. An upper ILD layer 302d is over the RRAM device 111. In some embodiments, the upper ILD layer 302d may comprise one or more of silicon dioxide, SiCOH, a fluorosilicate glass, a phosphate glass (e.g., borophosphate silicate glass), or the like.

Figure 4:
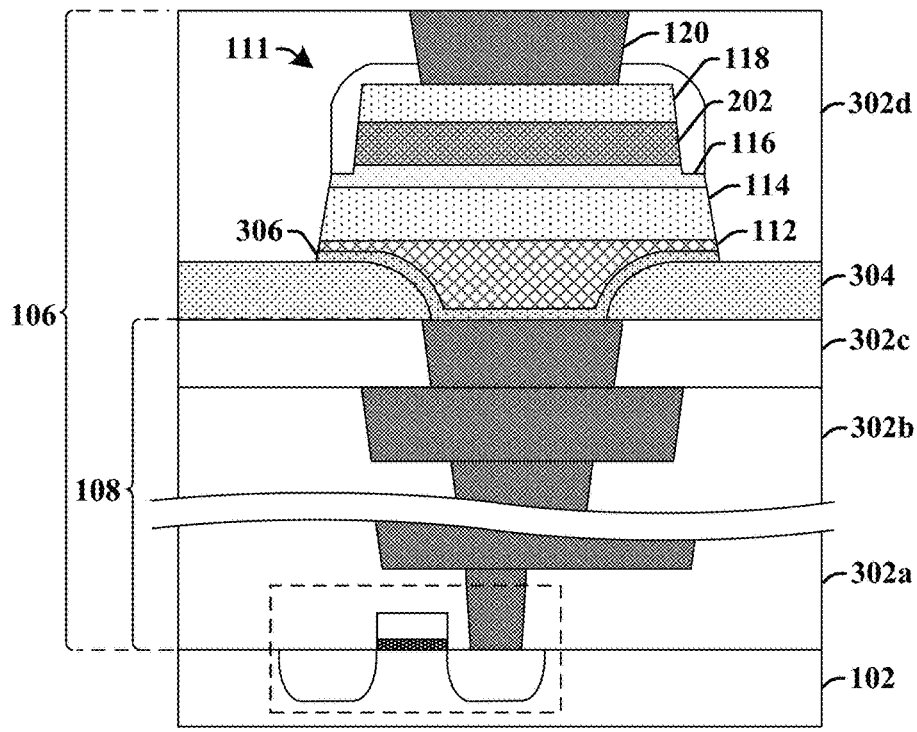

FIG. 4 illustrates a cross-sectional view of some additional embodiments of an integrated chip 400 having an RRAM device over a reactivity reducing layer.

The integrated chip 400 comprises one or more lower interconnect layers 108 disposed within one or more lower ILD layers 302a-302c over a substrate 102. A lower insulating layer 304 is over the one or more lower ILD layers 302a-302c and comprises sidewalls that define an opening extending through the lower insulating layer 304.

A bottom electrode diffusion barrier 306 is disposed along the sidewalls of the lower insulating layer 304 and over the one or more lower interconnect layers 108. The bottom electrode diffusion barrier 306 may continuously extends from a first sidewall of the lower insulating layer 304 to a second sidewall of the lower insulating layer 304. In some embodiments, the bottom electrode diffusion barrier 306 has a substantially constant thickness between outermost sidewalls of the bottom electrode diffusion barrier 306. In some embodiments, the bottom electrode diffusion barrier 306 may comprise a refractory metal or a refractory metal nitride, such as tantalum, tantalum nitride, titanium, titanium nitride, or the like.

A reactivity reducing layer 112 is arranged over the bottom electrode diffusion barrier 306 and has a second electronegativity. The reactivity reducing layer 112 extends from directly between the sidewalls of the lower insulating layer 304 to over the lower insulating layer 304. In some embodiments, the reactivity reducing layer 112 may completely cover the bottom electrode diffusion barrier 306. In some embodiments, the reactivity reducing layer 112 may have a greater thickness at a center of the reactivity reducing layer 112 than along outermost edges. In some embodiments, the reactivity reducing layer 112 may have a substantially planar upper surface facing away from the substrate 102.

An RRAM device 111 is disposed on the reactivity reducing layer 112. The RRAM device 111 has a bottom electrode 114 separated from a top electrode 118 by way of a data storage layer 116. The bottom electrode 114 is disposed on the reactivity reducing layer 112. The bottom electrode 114 has a lower surface comprising a material having a first electronegativity that is less than or equal to a second electronegativity of the reactivity reducing layer 112. The material within the lower surface of the bottom electrode 114 contacts the reactivity reducing layer 112 along an interface.

Figure 5:
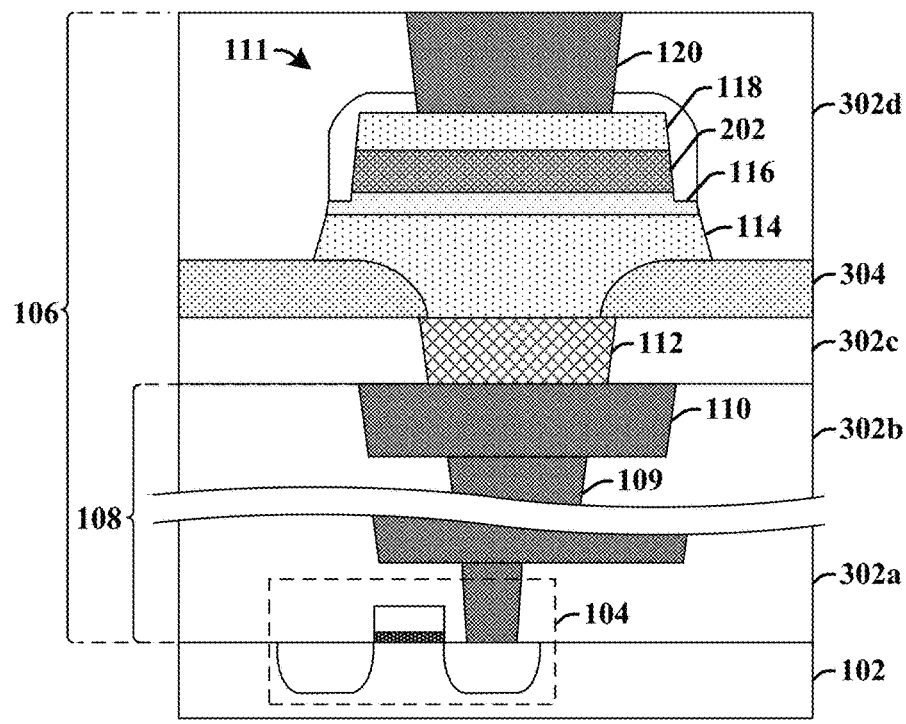

FIG. 5 illustrates a cross-sectional view of some additional embodiments of an integrated chip 500 having an RRAM device over a reactivity reducing layer.

The integrated chip 500 comprises one or more lower interconnect layers 108 disposed within one or more lower ILD layers 302a-302b over a substrate 102. A lower ILD layer 302c is disposed over the one or more lower ILD layers 302a-302b. A reactivity reducing layer 112 is laterally surrounded by the lower ILD layer 302c. The reactivity reducing layer 112 has a second electronegativity. A lower insulating layer 304 is over lower ILD layer 302c and the reactivity reducing layer 112, such that the lower ILD layer 302c and the reactivity reducing layer 112 have upper surfaces that are below a bottom of the lower insulating layer 304. The lower insulating layer 304 comprises sidewalls that define an opening extending through the lower insulating layer 304. The opening in the lower insulating layer 304 is directly over the reactivity reducing layer 112.

An RRAM device 111 is disposed over the lower insulating layer 304. The RRAM device 111 has a bottom electrode 114 separated from a top electrode 118 by way of a data storage layer 116. The bottom electrode 114 extends from directly between sidewalls of the lower insulating layer 304 to over the lower insulating layer 304. The bottom electrode 114 has a lower surface contacting the reactivity reducing layer 112. The lower surface of the bottom electrode 114 comprises a material having a first electronegativity that is less than or equal to the second electronegativity.

Figure 6:
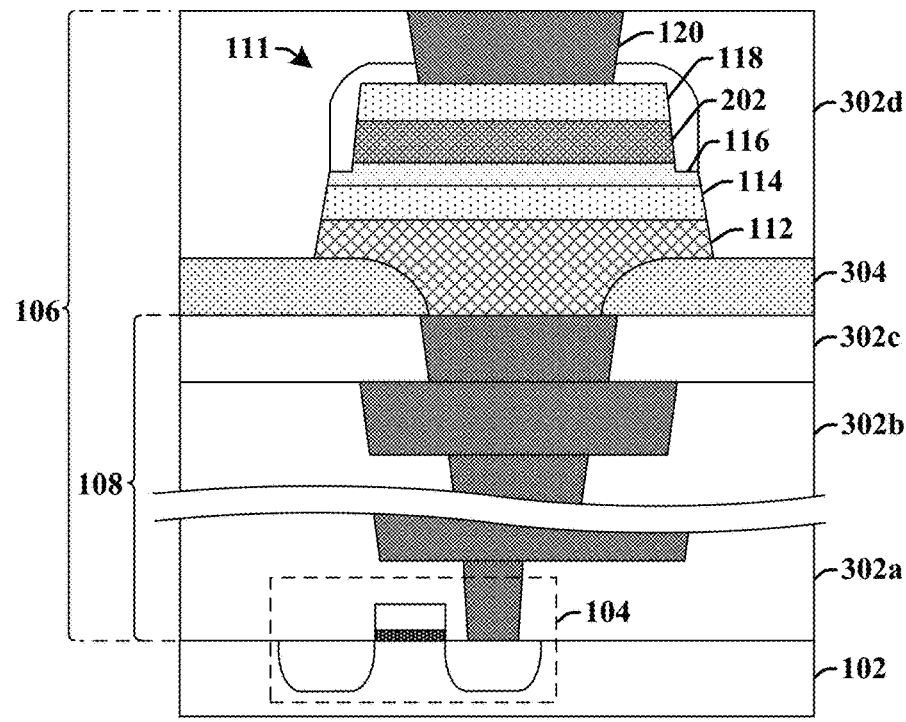

FIG. 6 illustrates a cross-sectional view of some additional embodiments of an integrated chip 600 having an RRAM device over a reactivity reducing layer.

The integrated chip 600 comprises one or more lower interconnect layers 108 disposed within one or more lower ILD layers 302a-302c over a substrate 102. A lower insulating layer 304 is over the one or more lower ILD layers 302a-302c and comprises sidewalls that define an opening extending through the lower insulating layer 304.

A reactivity reducing layer 112 is arranged on the one or more lower interconnect layers 108. The reactivity reducing layer 112 has a second electronegativity. The reactivity reducing layer 112 extends from directly between the sidewalls of the lower insulating layer 304 to over the lower insulating layer 304. In some embodiments, the reactivity reducing layer 112 comprises a material (e.g., titanium, titanium nitride, or the like), which is configured to act as a diffusion barrier. The reactivity reducing layer 112 may have sidewalls and a lower surface directly contacting the lower insulating layer 304. In some embodiments, the reactivity reducing layer 112 may have a substantially planar upper surface facing away from the substrate 102.

An RRAM device 111 is disposed over the reactivity reducing layer 112. The RRAM device 111 has a bottom electrode 114 separated from a top electrode 118 by way of a data storage layer 116. The bottom electrode 114 has a lower surface comprising a material having a first electronegativity that is less than or equal to the second electronegativity. The lower surface of the bottom electrode 114 may contact the reactivity reducing layer 112.

Figure 7:
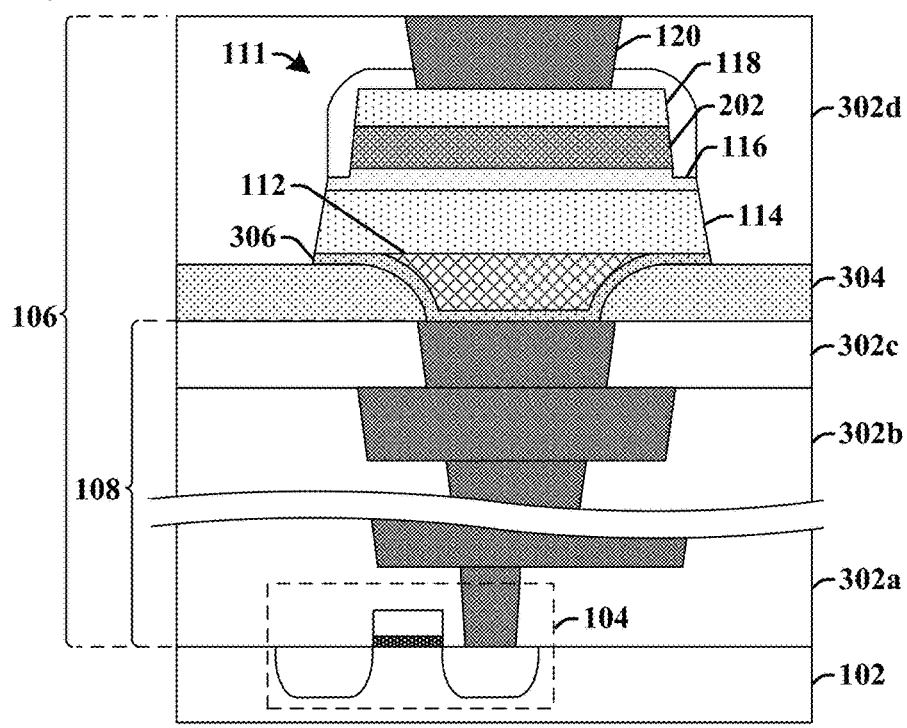

FIG. 7 illustrates a cross-sectional view of some additional embodiments of an integrated chip 700 having an RRAM device over a reactivity reducing layer.

The integrated chip 700 comprises a lower insulating layer 304 over one or more lower ILD layers 302a-302c surrounding one or more lower interconnect layers 108. The lower insulating layer 304 comprises sidewalls that define an opening extending through the lower insulating layer 304.

A bottom electrode diffusion barrier 306 is disposed within the opening. The bottom electrode diffusion barrier 306 lines sidewalls of the lower insulating layer 304. A reactivity reducing layer 112 is arranged directly on the bottom electrode diffusion barrier 306. The reactivity reducing layer 112 has a top surface that is substantially co-planar with a top surface of the reactivity reducing layer 112. The reactivity reducing layer 112 has a second electronegativity.

An RRAM device 111 is disposed over the reactivity reducing layer 112. The RRAM device 111 has a bottom electrode 114 separated from a top electrode 118 by way of a data storage layer 116. The bottom electrode 114 has a lower surface comprising a material having a first electronegativity that is less than or equal to the second electronegativity. The lower surface of the bottom electrode 114 may contact the reactivity reducing layer 112 and the bottom electrode diffusion barrier 306.

Figure 8A:
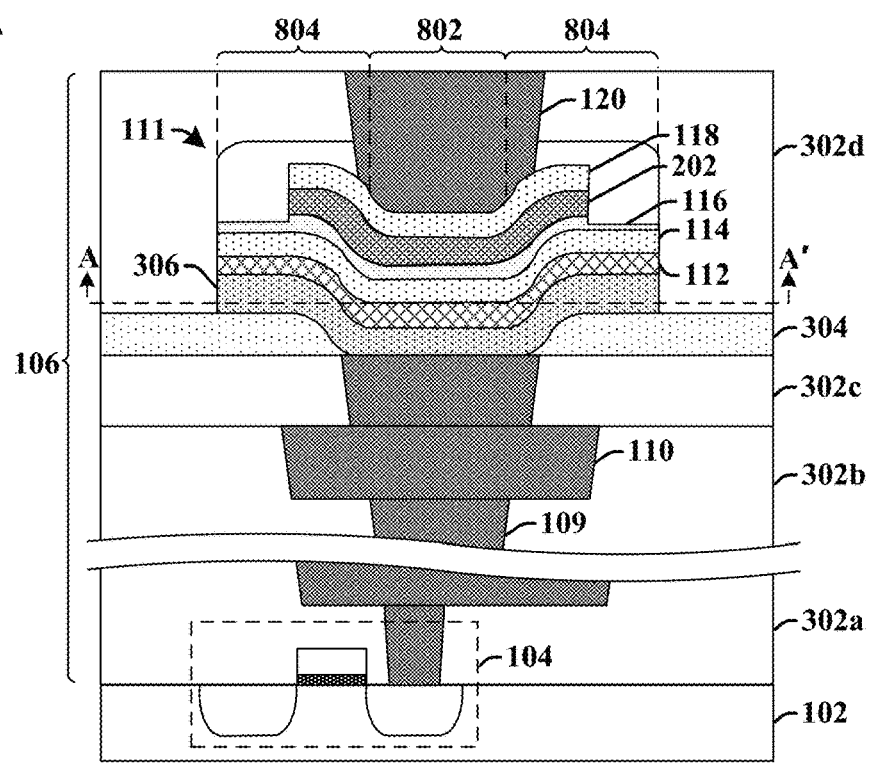
FIGS. 8A-8B illustrate some additional embodiments of an integrated chip having an RRAM device over a reactivity reducing layer.
Figure 8B:
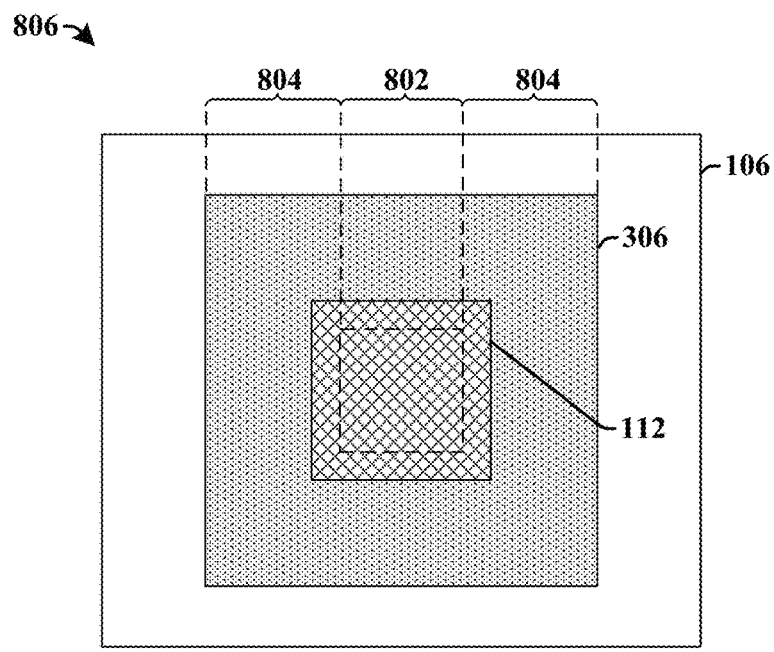

FIGS. 8A-8B illustrate some additional embodiments of an integrated chip having an RRAM device over a reactivity reducing layer.

As shown in cross-sectional view 800 of FIG. 8A, the integrated chip comprises one or more lower interconnect layers 108 disposed within one or more lower ILD layers 302a-302c over a substrate 102. A lower insulating layer 304 is over the one or more lower ILD layers 302a-302c and comprises sidewalls that define an opening extending through the lower insulating layer 304 directly over the one or more lower interconnect layers 108.

A bottom electrode diffusion barrier 306 is disposed along the sidewalls of the lower insulating layer 304 and over the one or more lower interconnect layers 108. A reactivity reducing layer 112 is arranged over the bottom electrode diffusion barrier 306 and has a second electronegativity. An RRAM device 111 arranged over the reactivity reducing layer 112. The RRAM device 111 comprises a data storage layer 116 arranged between a bottom electrode 114 and a top electrode 118. The bottom electrode 114 has a lower surface with a material having a first electronegativity that is less than or equal to a second electronegativity of the reactivity reducing layer 112.

The bottom electrode diffusion barrier 306, the reactivity reducing layer 112, the bottom electrode 114, the data storage layer 116, the capping layer 202, and the top electrode 118 respectively have an inner region 802 laterally surrounded by an outer region 804. Layers within the inner region 802 respectively have a recessed upper surface arranged laterally between and vertically below upper surfaces of a corresponding layer within the outer region 804. For example, the reactivity reducing layer 112 has an upper surface within the inner region 802 that is laterally between and vertically below upper surfaces of the reactivity reducing layer 112 within the outer region 804. As shown in top-view 806 of FIG. 8B, the outer region 804 of the bottom electrode diffusion barrier 306 extends along an outermost perimeter of the bottom electrode diffusion barrier 306. In some embodiments, the outer region 804 may continually extend in an unbroken ring around the inner region 802.

In some embodiments, the bottom electrode diffusion barrier 306, the reactivity reducing layer 112, the bottom electrode 114, the data storage layer 116, the capping layer 202, and the top electrode 118 may respectively have a substantially equal thickness between outermost sidewalls. In some alternative embodiments, the inner region 802 of the data storage layer 116 may have a first thickness and the outer region 804 of the data storage layer 116 may have a second thickness that is less than the first thickness.

Figure 9A:
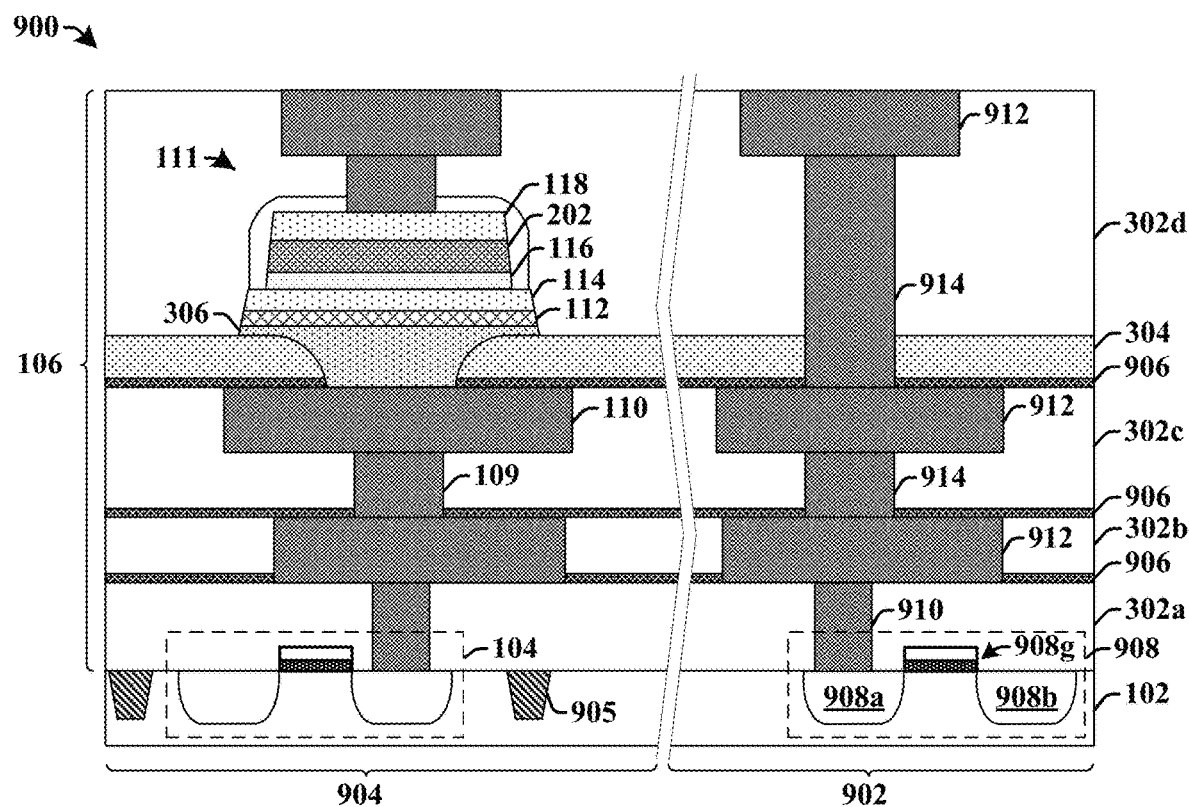
FIGS. 9A-9B illustrate cross-sectional views of some additional embodiments of an integrated chip having an RRAM device over a reactivity reducing layer.

FIG. 9A illustrates a cross-sectional view of some additional embodiments of an integrated chip 900 having an RRAM device over a reactivity reducing layer.

The integrated chip 900 comprises a substrate 102 including a logic region 902 and an embedded memory region 904. A dielectric structure 106 is arranged over the substrate 102. The dielectric structure 106 comprises a plurality of stacked ILD layers 302a-302d separated by etch stop layers 906. In some embodiments, the etch stop layers 906 may comprise a nitride (e.g., silicon nitride), a carbide (e.g., silicon carbide), or the like.

The logic region 902 comprises a transistor device 908 arranged within the substrate 102. The transistor device 908 comprises a source region 908a, a drain region 908b separated from the source region 908a by a channel region, and a gate structure 908g over the channel region. In some embodiments, the transistor device 908 may comprise a high-k metal gate (HKMG) transistor. In such embodiments, the gate structure 908g may comprise a metal gate electrode (e.g., comprising aluminum, ruthenium, palladium, or the like) and a gate dielectric comprising a high-k dielectric (e.g., comprising aluminum oxide, hafnium oxide, or the like). In other embodiments, the gate structure 908g may comprise a polysilicon gate electrode and a gate dielectric comprising an oxide (e.g., silicon dioxide).

The source region 908a and/or the drain region 908b is coupled to a plurality of interconnect layers surrounded by the dielectric structure 106. The plurality of interconnect layers comprise conductive contacts 910, interconnect wires 912, and interconnect vias 914. In some embodiments, the plurality of interconnect layers may comprise copper, tungsten, aluminum, and/or the like.

The embedded memory region 904 comprises an access device 104 (e.g., an access transistor) arranged within the substrate 102. The access device 104 is coupled to an RRAM device 111 having a bottom electrode 114 separated from a top electrode 118 by way of a data storage layer 116. The bottom electrode 114 contacts a reactivity reducing layer 112. The reactivity reducing layer 112 is arranged along a horizontal plane that intersects sidewalls of one of the interconnect vias 914 within the logic region 902. In some embodiments, one or more isolation structures 905 may be arranged within the substrate 102 on opposing sides of the access device 104. The isolation structures 905 may comprise one or more dielectric materials arranged within trenches defined by interior surfaces of the substrate 102. In some embodiments, the isolation structures 905 may comprise shallow trench isolation (STI) structures. In some such embodiments, the isolation structures 905 may comprise a same isolation structure continuously extending in a closed loop around a perimeter of the access device 104.

Figure 9B:
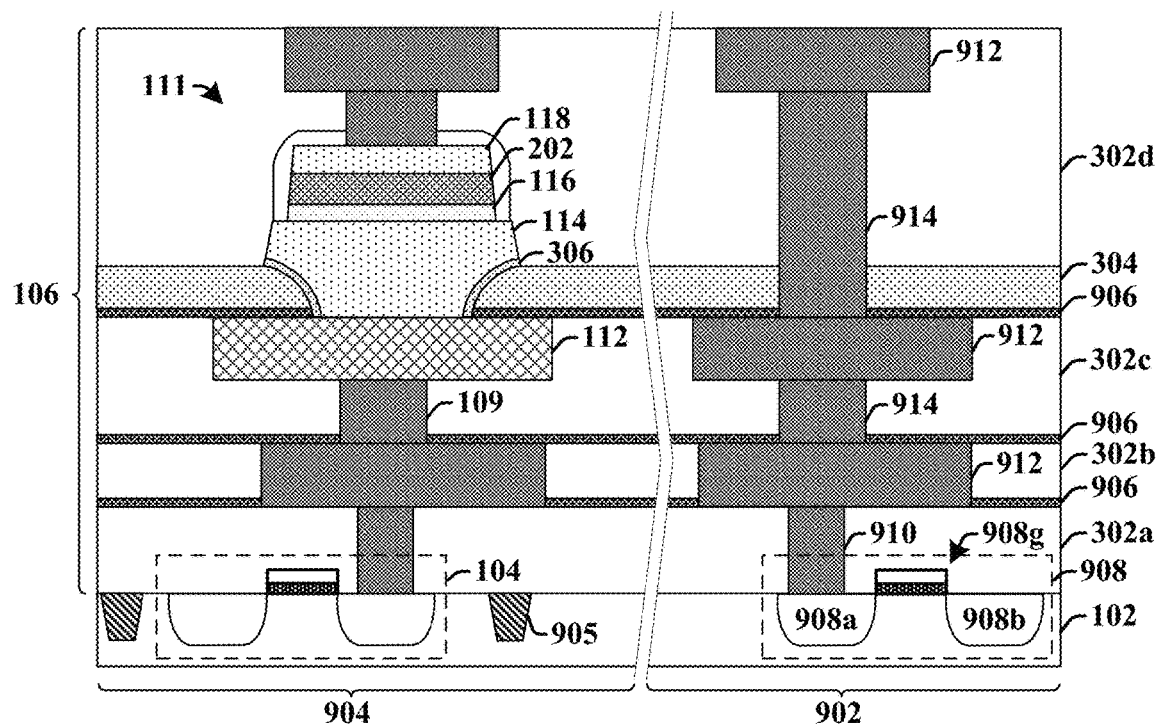

FIG. 9B illustrates a cross-sectional view of some alternative embodiments of an integrated chip 916 having an RRAM device over a reactivity reducing layer.

The integrated chip 916 includes a substrate 102 having a logic region 902 and an embedded memory region 904. The embedded memory region 904 comprises an access device 104 (e.g., access transistor) arranged within the substrate 102. The access device 104 is coupled to an RRAM device 111 having a bottom electrode 114 separated from a top electrode 118 by way of a data storage layer 116. The bottom electrode 114 contacts a reactivity reducing layer 112. The reactivity reducing layer 112 is arranged along a horizontal plane that intersects sidewalls of one of the interconnect wires 912 within the logic region 902.

Figure 10:
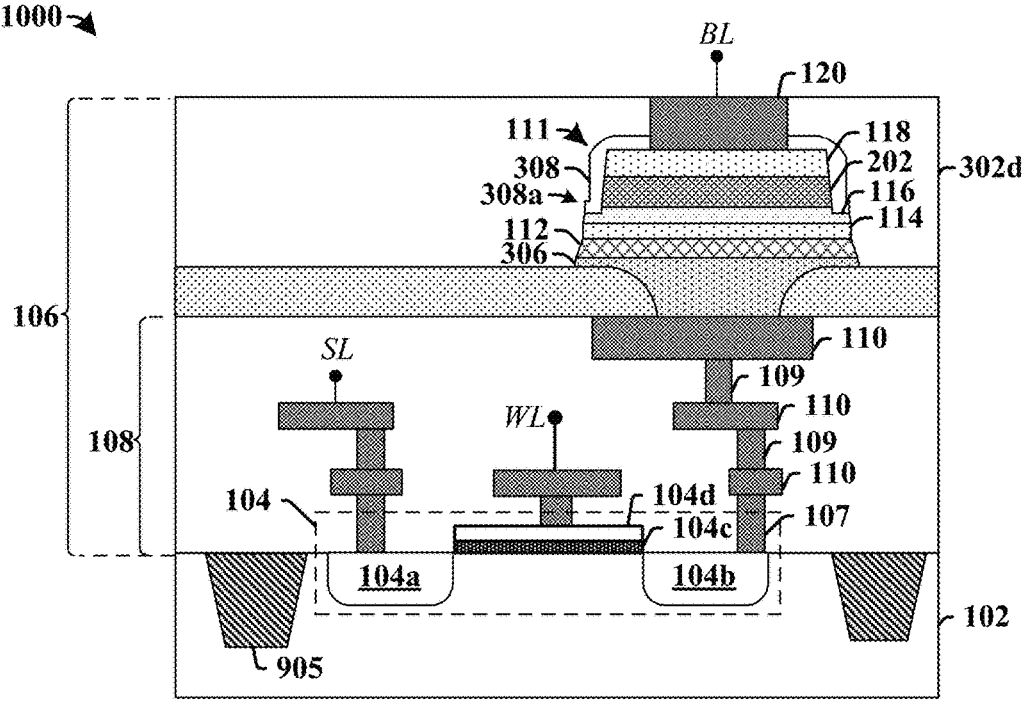
FIG. 10 illustrates a cross-sectional view of some additional embodiments of an integrated chip having an RRAM device over a reactivity reducing layer.

FIG. 10 illustrates a cross-sectional view of some additional embodiments of an integrated chip 1000 having an RRAM device over a reactivity reducing layer.

The integrated chip 1000 comprises a 1T1R RRAM cell architecture having an access device 104 connected to an RRAM device 111. The access device 104 is arranged within a substrate 102. In some embodiments, the access device 104 may comprise a MOSFET device having a gate electrode 104d that is arranged between a source region 104a and a drain region 104b and that is separated from the substrate 102 by a gate dielectric 104c. In other embodiments, the access device 104 may comprise a HEMT, a BJT, or the like.

A dielectric structure 106 is arranged over the substrate 102. One or more lower interconnect layers 108 including conductive contacts 107, interconnect vias 109, and interconnect wires 110, are surrounded by the dielectric structure 106. The interconnect wires 110 include a source-line SL comprising a first interconnect wire that is electrically coupled to the source region 104a. In some embodiments, the source-line SL may be arranged in a second interconnect wire layer that is connected to the source region 104a through a conductive contact, a first interconnect wire, and a first interconnect via. The interconnect wires 110 further comprise a word-line WL comprising a second interconnect wire that is electrically coupled to the gate electrode 104d. In some embodiments, the word-line WL may be arranged in the first interconnect wire layer and is connected to the gate electrode 104d by way of a conductive contact.

An RRAM device 111 is arranged within the dielectric structure 106 over a reactivity reducing layer 112. The RRAM device comprises a bottom electrode 114 separated from a top electrode 118 by a data storage layer 116. The bottom electrode 114 is directly connected to the drain region 104b by the reactivity reducing layer 112 and the one or more lower interconnect layers 108. The top electrode 118 is further coupled to a bit-line BL by way of an upper interconnect structure 120.

In some embodiments, sidewall spacers 308 are arranged along opposing sides of the top electrode 118. In some embodiments, the sidewall spacers 308 may have a horizontally extending segment 308a that protrudes outward from a sidewall of the sidewall spacers 308. In some embodiments, horizontally extending segments 308a may protrude outward from opposing sides of the sidewall spacers 308. In other embodiments (not shown), a horizontally extending segment 308a may protrude outward from one side of the sidewall spacers 308 and not from an opposing side of the sidewall spacers 308.

Although integrated chip 1000 illustrates the word-line WL, the source-line SL, the bit-line BL, and the RRAM device 111 as being located at certain levels within a BEOL (back-end-of-the-line) stack, it will be appreciated that the position of these elements is not limited to those illustrated positions. Rather, the elements may be at different locations within a BEOL stack. For example, in some alternative embodiments, the RRAM device 111 may be located between a second and third metal interconnect wire.

Figure 11:
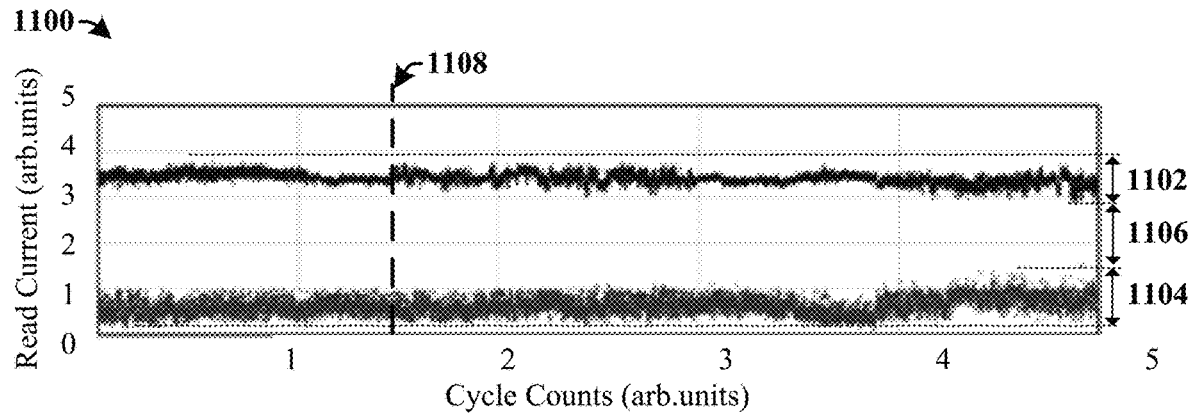
FIG. 11 illustrates a graph showing some embodiments of data cycling of a disclosed RRAM device over a reactivity reducing layer.

FIG. 11 illustrates a graph 1100 showing some embodiments of data cycling of a disclosed RRAM device over a reactivity reducing layer. The graph 1100 shows a read current along a y-axis and a cycle-count (i.e., a number of read/write cycles) along an x-axis.

As shown in the graph 1100, a read current has a first current range 1102 for stored data states having a first value (e.g., for data states having a "1") and a second current range 1104 for stored data states having a second value (e.g., for data states having a "0"). A read window 1106 is a difference in signals (e.g., current) read out from an RRAM device between a "1" and a 37 0. During operation of an RRAM device (e.g., RRAM device 111 of FIG. 1), a sufficiently large read window is to be maintained since a larger read window 1106 makes it easier to differentiate different data states from one another during a read operation.

An RRAM device that does not have a reactivity reducing layer (e.g., reactivity reducing layer 112 of FIG. 1) will have a read window that becomes too small to be reliable after a number of read and/or write operations (denoted by line 1108). However, the reactivity reducing layer (e.g., reactivity reducing layer 112 of FIG. 1) provides for an RRAM device that is able to maintain a sufficient read window for a relatively large number of read and/or write operations (e.g., a number of read and/or write operations that is three or more times larger than a number of read and/or write operations able to be performed by an RRAM device that does not have a reactivity reducing layer).

FIGS. 12-21 illustrates cross-sectional views 1200-2100 of some embodiments of method of forming an integrated chip having an RRAM device over a reactivity reducing layer. Although FIGS. 12-21 are described in relation to a method, it will be appreciated that the structures disclosed in FIGS. 12-21 are not limited to such a method, but instead may stand alone as structures independent of the method.

Figure 12:
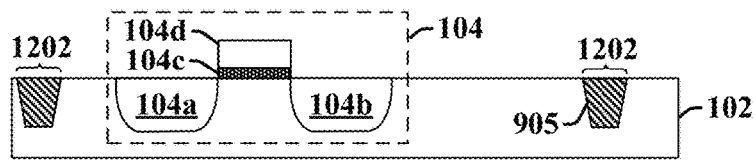
FIGS. 12-21 illustrate cross-sectional views of some embodiments of method of forming an integrated chip having an RRAM device over a reactivity reducing layer.

As shown in cross-sectional view 1200 of FIG. 12, an access device 104 is formed within a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the access device 104 may comprise a transistor device formed by depositing a gate dielectric film and a gate electrode film over the substrate 102. The gate dielectric film and the gate electrode film are subsequently patterned to form a gate dielectric 104c and a gate electrode 104d. The substrate 102 may be subsequently implanted to form a source region 104a and a drain region 104b within the substrate 102 on opposing sides of the gate electrode 104d.

In some embodiments, one or more isolation structures 905 may be formed within the substrate 102 on opposing sides of the access device 104. In some embodiments, the one or more isolation structures 905 may be formed by selectively etching the substrate 102 to form one or more shallow trenches 1202 and subsequently forming one or more dielectric materials within the one or more shallow trenches 1202. In some embodiments, the etching process may comprise a dry etching process. For example, the etching process may comprise a coupled plasma etching process, such as an inductively coupled plasma (ICP) etching process or a capacitively coupled plasma (CCP) etching process. In other embodiments, the etching process may comprise a wet etching process.

Figure 13:
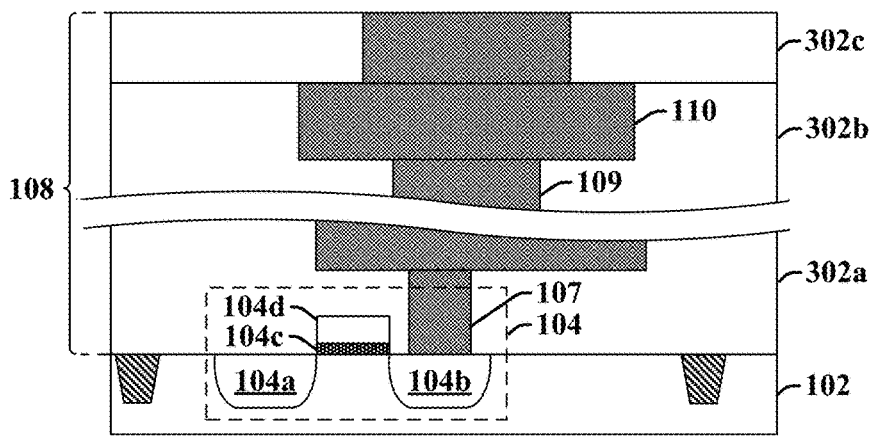

As shown in cross-sectional view 1300 of FIG. 13, one or more lower interconnect layers 108 are formed within one or more lower inter-level dielectric (ILD) layers 302a-302c over the substrate 102. The one or more lower interconnect layers 108 may comprise conductive contacts 107, interconnect vias 109, and interconnect wires 110. The one or more lower interconnect layers 108 may be formed by forming one of the one or more ILD layers 302a-302c over the substrate 102, selectively etching the ILD layer (e.g., an oxide, a low-k dielectric, or an ultra low-k dielectric) to define a via hole and/or a trench within the ILD layer, forming a conductive material (e.g., copper, aluminum, etc.) within the via hole and/or a trench to fill the opening, and performing a planarization process (e.g., a chemical mechanical planarization process).

Figure 14:
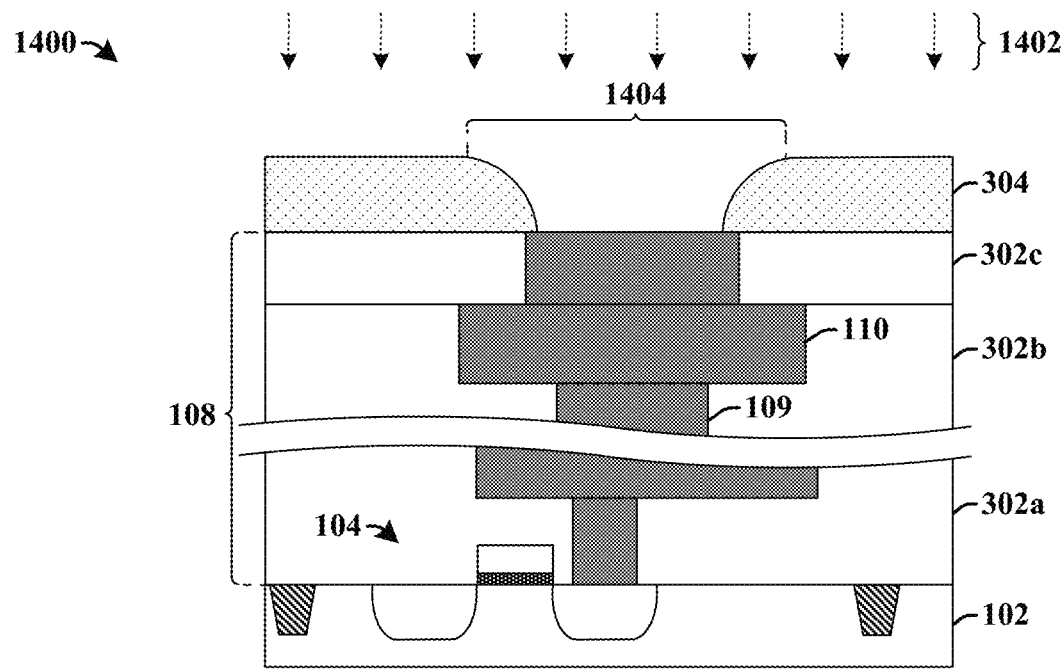

As shown in cross-sectional view 1400 of FIG. 14, a lower insulating layer 304 is formed onto the one or more lower interconnect layers 108 and the one or more lower ILD layers 302a-302c. In some embodiments, the lower insulating layer 304 may comprise silicon-nitride, silicon-carbide, or the like. In some embodiments, the lower insulating layer 304 may be formed by a deposition technique (e.g., physical vapor deposition (PVD), chemical vapor deposition (CVD), PE-CVD, atomic layer deposition (ALD), sputtering, etc.) to a thickness in a range of between approximately 200 angstroms and approximately 300 angstroms. After deposition, the lower insulating layer 304 is selectively patterned to define an opening 1404 extending through the lower insulating layer 304 to the one or more lower interconnect layers 108. In some embodiments, the lower insulating layer 304 may be selectively patterned according to an etchant 1402 (e.g., a dry etchant or a wet etchant).

Figure 15:
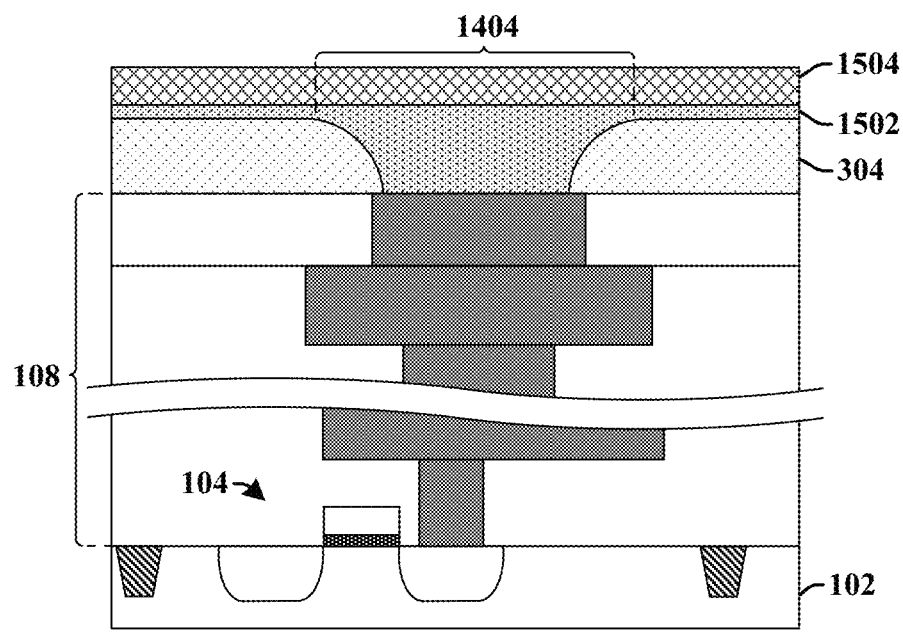

As shown in cross-sectional view 1500 of FIG. 15, in some embodiments, a bottom electrode diffusion barrier layer 1502 is formed over the lower insulating layer 304 and the one or more lower interconnect layers 108. The bottom electrode diffusion barrier layer 1502 extends from within the opening 1404 to a position overlying the lower insulating layer 304. In some embodiments, the bottom electrode diffusion barrier layer 1502 may comprise tantalum nitride, titanium nitride, or the like. A planarization process (e.g., a chemical mechanical planarization process) may subsequently be performed. In some embodiments, the planarization process results in the bottom electrode diffusion barrier layer 1502 having a thickness in a range of between approximately 100 angstroms and approximately 300 angstroms over the lower insulating layer 304. In some embodiments, the bottom electrode diffusion barrier layer 1502 may be formed by a deposition process (e.g., CVD, PVD, ALD, PE-CVD, or the like).

A reactivity reducing coating 1504 is formed over the bottom electrode diffusion barrier layer 1502. The reactivity reducing coating 1504 has a second electronegativity. In some embodiments, the second electronegativity may be greater than or equal to 1.5. In other embodiments, the second electronegativity may be greater than or equal to 2.0. In some embodiments, the reactivity reducing coating 1504 may be formed by a deposition process (e.g., CVD, PVD, ALD, PE-CVD, or the like). In some embodiments, the reactivity reducing coating 1504 may be formed to a thickness that is in a range of between approximately 1 nm and approximately 200 nm.

Figure 16:
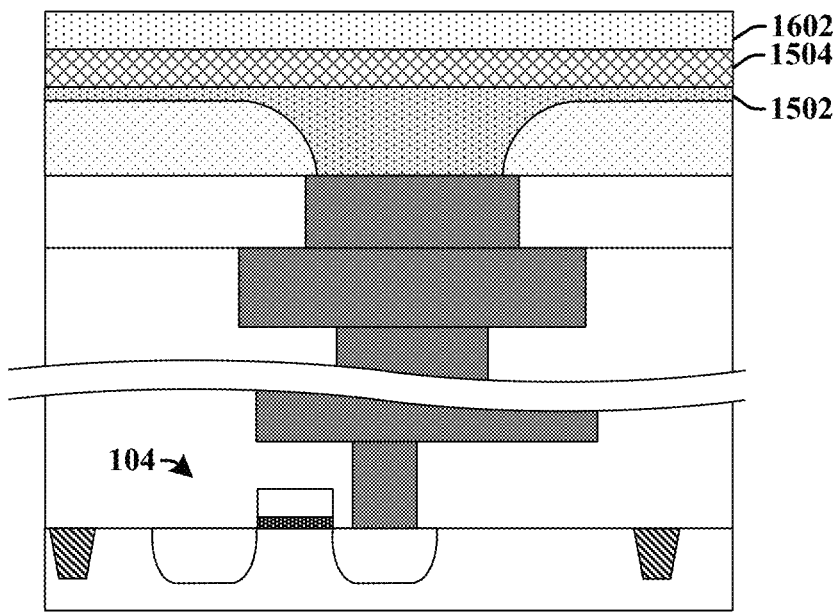

As shown in cross-sectional view 1600 of FIG. 16, a bottom electrode layer 1602 is formed on the reactivity reducing coating 1504. In some embodiments, the bottom electrode layer 1602 has a lower surface comprising a material having a first electronegativity that is less than or equal to the second electronegativity of the reactivity reducing coating 1504. In some embodiments, the entirety of the bottom electrode layer 1602 may be the material. In some embodiments, the first electronegativity may be approximately 1.5. In other embodiments, the first electronegativity may be greater than 1.5. In some embodiments, the bottom electrode layer 1602 may comprise a metal, a metal-nitride, a metal oxide, or doped polysilicon formed by way of a deposition process (e.g., PVD, CVD, or the like).

In some embodiments, the bottom electrode layer 1602 may be formed in-situ (e.g., without breaking a vacuum of a processing chamber in which the depositions are performed) with the reactivity reducing coating 1504. In such embodiments, a material of the reactivity reducing coating 1504 having the second electronegativity directly contacts the material of the bottom electrode layer 1602 having the first electronegativity along an interface. In some embodiments, the bottom electrode layer 1602 may be formed to a thickness $T_{BE}$ in a range of between approximately 1 nm and approximately 200 nm. In other embodiments, the bottom electrode layer 1602 may be formed ex-situ with the reactivity reducing coating 1504. In some such embodiments, an additional etch process may be performed to remove any native oxide from a top of the reactivity reducing coating

1504 prior to the formation of the bottom electrode layer 1602, so that a material of the reactivity reducing coating 1504 having the second electronegativity directly contacts the material of the bottom electrode layer 1602 having the first electronegativity along an interface.

Figure 17:
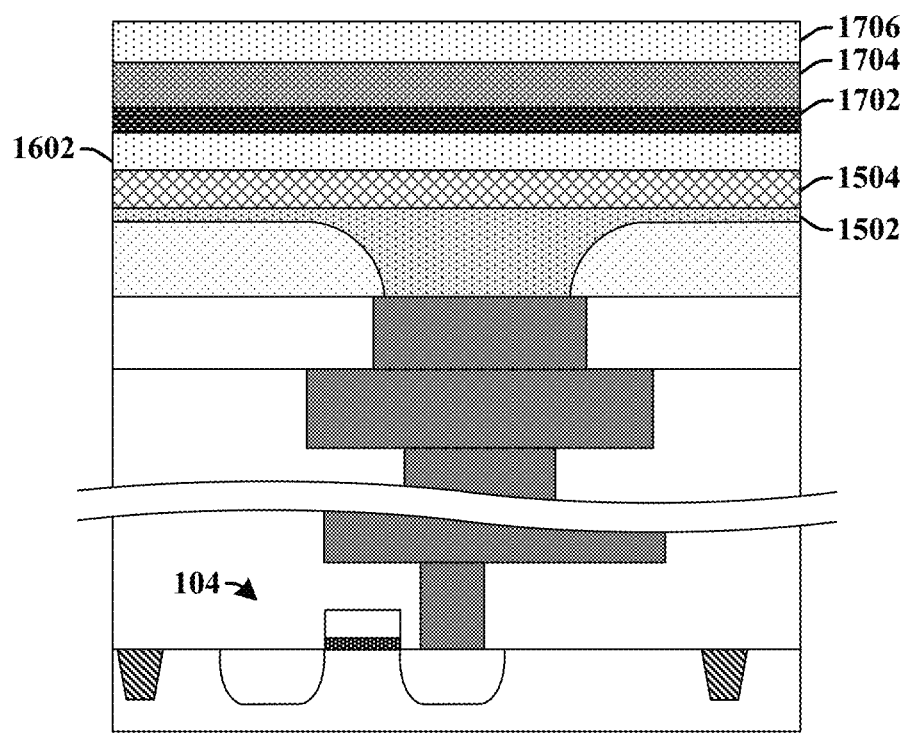

As shown in cross-sectional view 1700 of FIG. 17, a data storage element 1702 is formed on the reactivity reducing coating 1504. In some embodiments, the data storage element 1702 may comprise a high-k dielectric material having a variable resistance. For example, in some embodiments, the data storage element 1702 may comprise hafnium oxide (HfO$_X$), zirconium oxide (ZrO$_X$), aluminum oxide (AlO$_X$), nickel oxide (NiO$_X$), tantalum oxide (TaO$_X$), titanium oxide (TiO$_X$), or the like. In some embodiments, the data storage element 1702 may be formed by way of a deposition technique (e.g., PVD, CVD, PE-CVD, sputtering, ALD, etc.) to a thickness in a range of between approximately 25 angstroms and approximately 75 angstroms.

In some embodiments, a capping film 1704 may be formed over the data storage element 1702. In various embodiments, the capping film 1704 may comprise a metal or a metal-oxide. In some embodiments, the capping film 1704 may be formed by way of a deposition technique (e.g., PVD, CVD, PE-CVD, sputtering, ALD, etc.).

A top electrode layer 1706 is formed over the data storage element 1702. The top electrode layer 1706 may comprise a metal, such as titanium, tantalum, or the like. In some embodiments, the top electrode layer 1706 may be formed by way of a deposition technique (e.g., PVD, CVD, PE-CVD, sputtering, ALD, or the like). In some embodiments, the top electrode layer 1706 may have a thickness in a range of between approximately 100 angstroms and approximately 400 angstroms.

Figure 18:
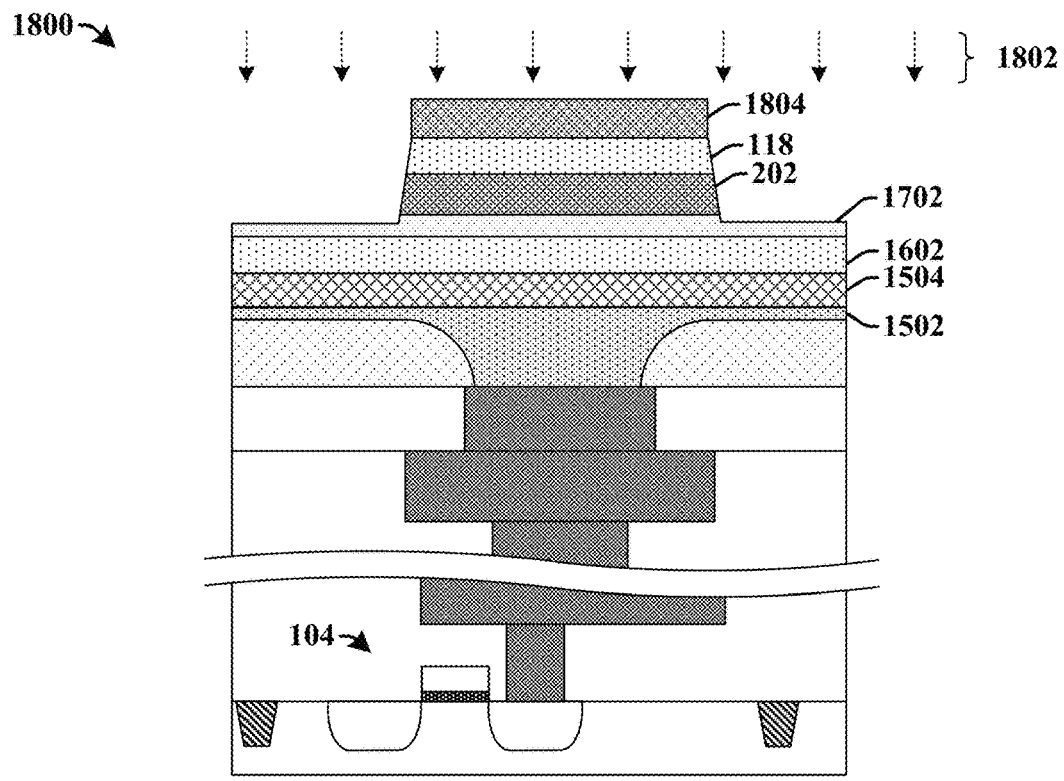

As shown in cross-sectional view 1800 of FIG. 18, a first patterning process is performed on the top electrode layer (1706 of FIG. 17). In some embodiments, the first patterning process comprises forming a masking layer 1804 over the top electrode layer (1706 of FIG. 17), and subsequently exposing the top electrode layer (1706 of FIG. 17) to a first etchant 1802 configured to define a top electrode 118 by selectively removing unmasked parts of the top electrode layer (1706 of FIG. 17). In some embodiments, the first etchant 1802 may also remove unmasked parts of the capping film 1704 to define a capping layer 202.

In various embodiments, the first etchant 1802 may comprise a dry etchant having an etching chemistry comprising a fluorine species (e.g., CF$_4$, CHF$_3$, C$_4$F$_8$, etc.) or a wet etchant comprising hydroflouric acid (HF). In some embodiments, the first patterning process may reduce a thickness of the masking layer 1804. For example, in some embodiments, the first patterning process may reduce a thickness of the masking layer 1804 by a range of between approximately 70% and approximately 85% (e.g., from approximately 550 angstroms to approximately 100 angstroms).

In some embodiments, over-etching of the top electrode layer (1706 of FIG. 17) may cause a part of the data storage element 1702 to be etched. For example, in some embodiments, a part of the data storage element 1702 may be etched away so that the data storage element 1702 has a sidewall that is laterally set-back from an outermost sidewall of the data storage element 1702.

Figure 19:
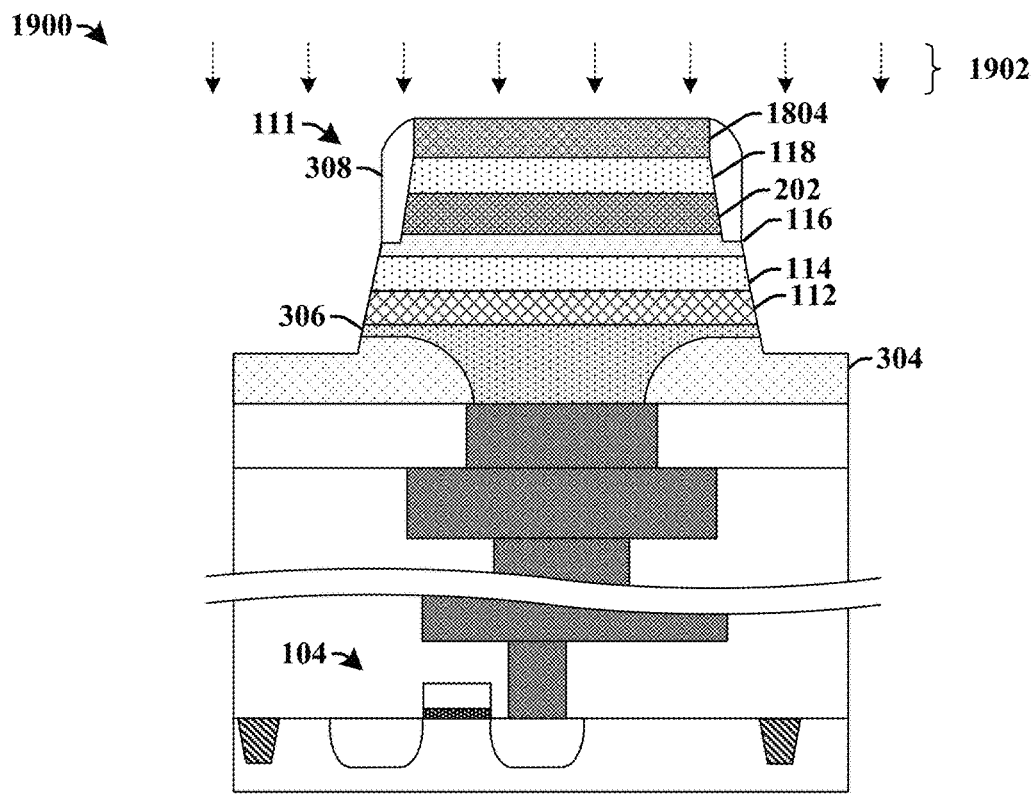

As shown in cross-sectional view 1900 of FIG. 19, sidewall spacers 308 may be formed on opposing sides of the top electrode 118. In some embodiments, the sidewall spacers 308 may be formed by depositing a spacer layer over the substrate 102 using a deposition technique (e.g., PVD, CVD, PE-CVD, ALD, sputtering, etc.). The spacer layer is subsequently etched to remove the spacer layer from horizontal surfaces, leaving the spacer layer along opposing sides of the top electrode 118 as the sidewall spacers 308. In various embodiments, the spacer layer may comprise silicon nitride, a silicon dioxide (SiO$_2$), silicon oxy-nitride (e.g., SiON), or the like. In various embodiments, the spacer layer may be formed to a thickness in a range of between approximately 400 angstroms and approximately 600 angstroms.

After formation of the sidewall spacers 308, a second patterning process is performed to define a data storage layer 116, a bottom electrode 114, a reactivity reducing layer 112, and a bottom electrode diffusion barrier 306. In some embodiments, the second patterning process selectively exposes the data storage element (1702 of FIG. 18), the bottom electrode layer (1602 of FIG. 18), the reactivity reducing coating (1504 of FIG. 18), and the bottom electrode diffusion barrier layer (1502 of FIG. 18) to a second etchant 1902 according to a mask comprising the masking layer 1804 and the sidewall spacers 308. The second etchant 1902 is configured to remove unmasked parts of the data storage element (1702 of FIG. 18), the bottom electrode layer (1602 of FIG. 18), the reactivity reducing coating (1504 of FIG. 18), and the bottom electrode diffusion barrier (1502 of FIG. 18). In various embodiments, the second etchant 1902 may comprise a dry etchant or a wet etchant.

In some embodiments, the second patterning process may reduce a thickness of unmasked regions of the lower insulating layer 304. For example, in some embodiments, the second patterning process may reduce a thickness of the unmasked regions of the lower insulating layer 304 by a range of between approximately 20% and approximately 35% (e.g., from approximately 270 angstroms to approximately 220 angstroms). Reducing the thickness of the unmasked regions of the lower insulating layer 304 causes the lower insulating layer 304 to have a greater thickness directly below the reactivity reducing layer 112 than outside of the reactivity reducing layer 112.

Figure 20:
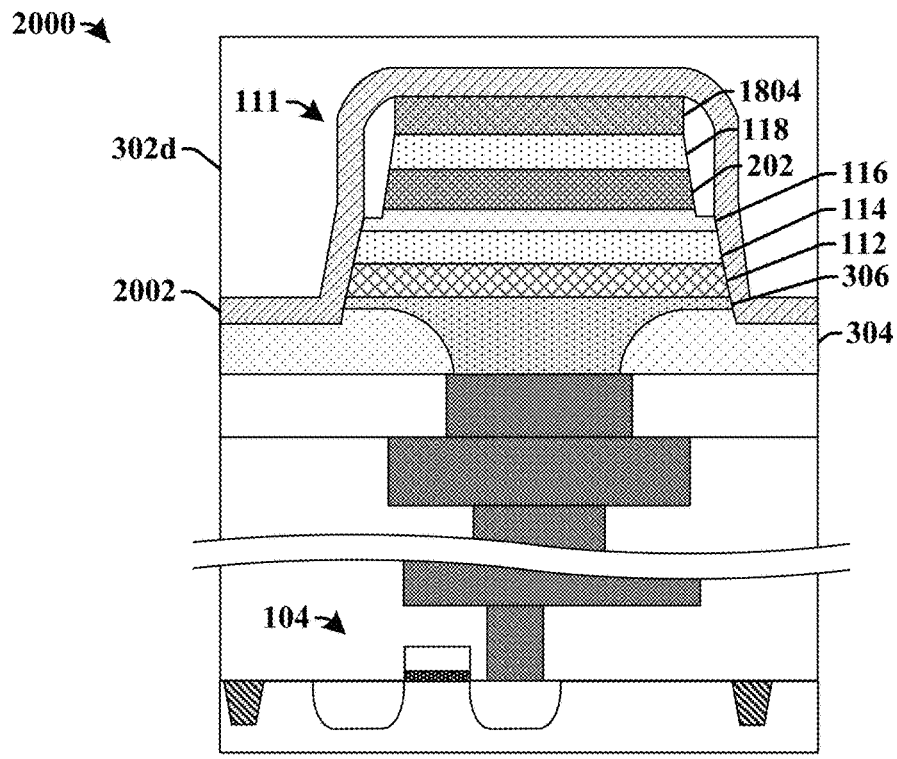

As shown in cross-sectional view 2000 of FIG. 20, an upper dielectric layer 2002 is formed over the substrate 102. An upper inter-level dielectric (ILD) layer 302*d* is subsequently formed over the upper dielectric layer 2002. The upper dielectric layer 2002 has a first side that abuts the lower insulating layer 304 and a second side that abuts the upper ILD layer 302*d*.

Figure 21:
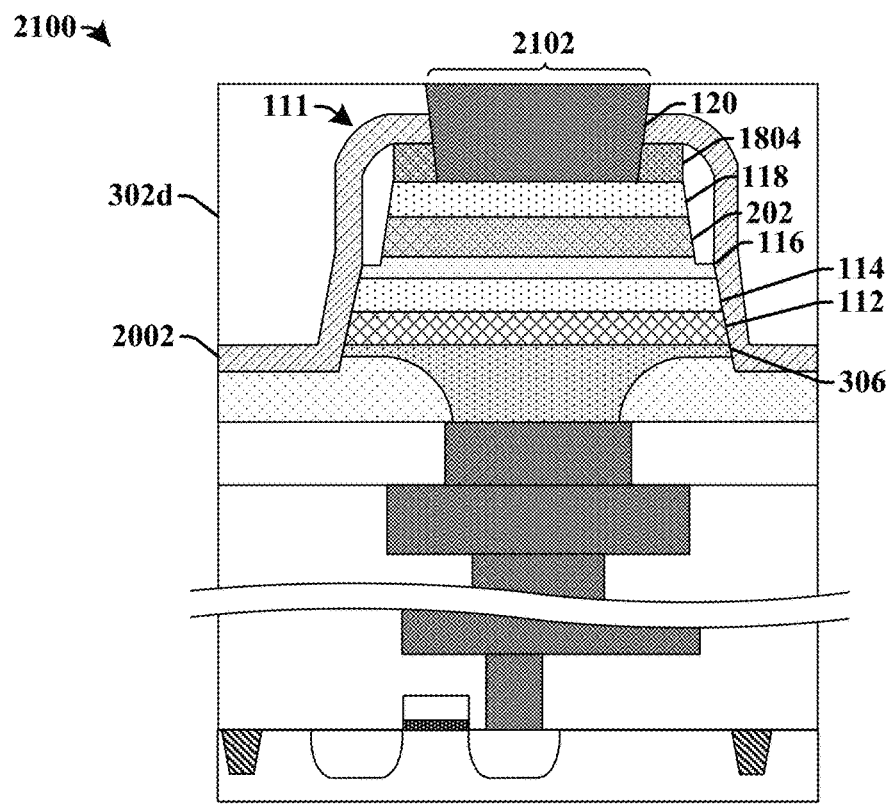

As shown in cross-sectional view 2100 of FIG. 21, an upper interconnect structure 120 is formed at a position abutting the top electrode 118. In various embodiments, the upper interconnect structure 120 may comprise an interconnect via or an interconnect wire. In some embodiments, the upper interconnect structure 120 may be formed by etching the upper ILD layer 302*d* to form an opening 2102 that extends through the upper ILD layer 302*d*, the upper dielectric layer 2002, and the masking layer 1804 to the top electrode 118. The opening 2102 is then filled with a conductive material (e.g., copper and/or aluminum) to form the upper interconnect structure 120.

Figure 22:
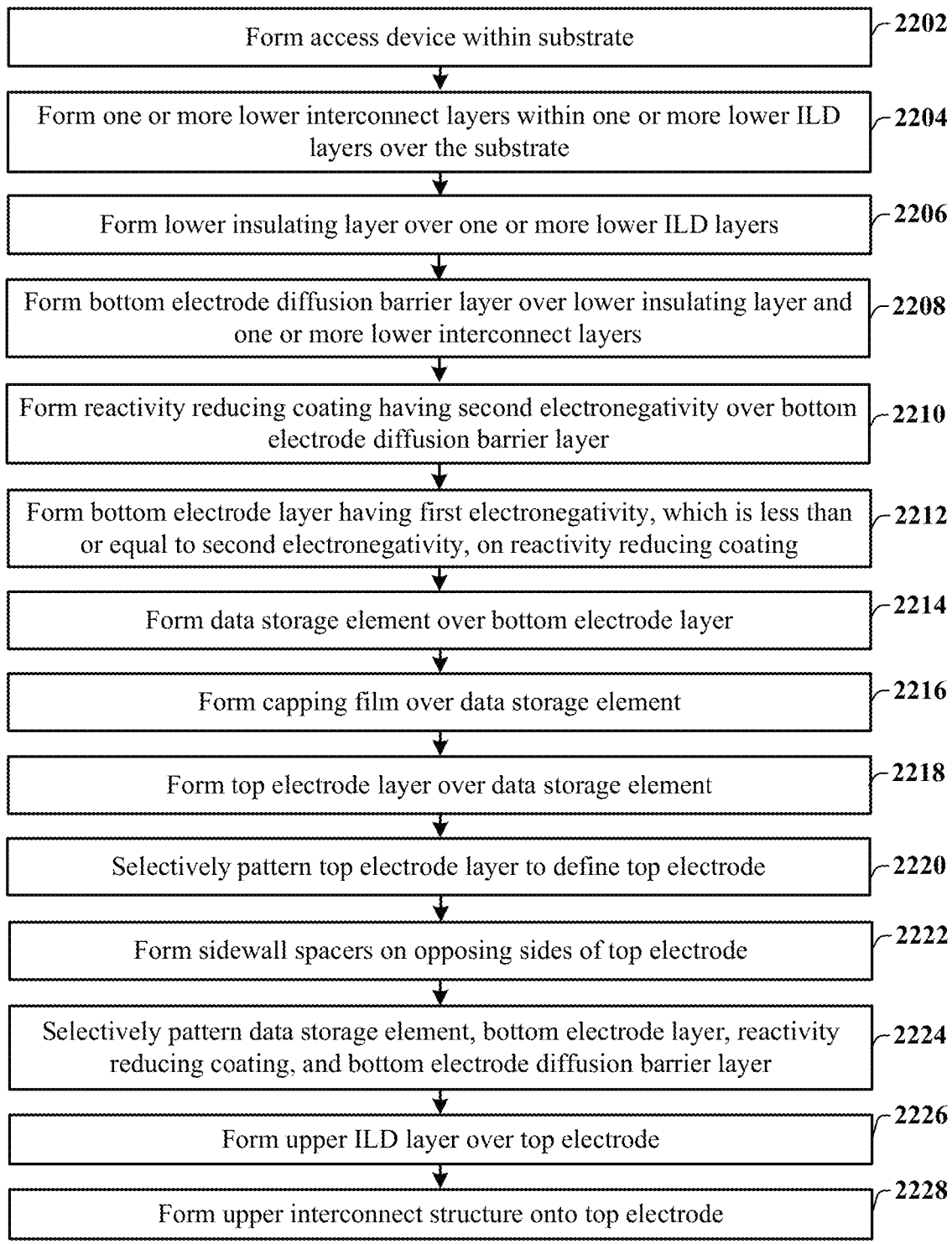
FIG. 22 illustrates a flow diagram of some embodiments of a method of forming an integrated chip having an RRAM device over a reactivity reducing layer.

FIG. 22 illustrates a flow diagram of some embodiments of a method 2200 of forming an integrated chip having an RRAM device over a reactivity reducing layer.

While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, an access device is formed within a substrate. FIG. 12 illustrates a cross-sectional view 1200 of some embodiments corresponding to act 2202.

At 2204, one or more lower interconnect layers are formed within one or more lower ILD layers over the substrate. FIG. 13 illustrates a cross-sectional view 1300 of some embodiments corresponding to act 2204.

At 2206, a lower insulating layer is formed over the one or more lower ILD layers. FIG. 14 illustrates a cross-sectional view 1400 of some embodiments corresponding to act 2206.

At 2208, a bottom electrode diffusion barrier layer may be formed over the lower insulating layer and the one or more lower interconnect layers, in some embodiments. FIG. 15 illustrates a cross-sectional view 1500 of some embodiments corresponding to act 2208.

At 2210, a reactivity reducing coating having a second electronegativity is formed over the bottom electrode diffusion barrier layer. FIG. 15 illustrates a cross-sectional view 1500 of some embodiments corresponding to act 2210.

At 2212, a bottom electrode layer having a first electronegativity is formed on the reactivity reducing coating. The second electronegativity is greater than or equal to the first electronegativity. FIG. 16 illustrates a cross-sectional view 1600 of some embodiments corresponding to act 2212.

At 2214, a data storage element is formed over the bottom electrode layer. FIG. 17 illustrates a cross-sectional view 1700 of some embodiments corresponding to act 2214.

At 2216, a capping film is formed over the data storage element. FIG. 17 illustrates a cross-sectional view 1700 of some embodiments corresponding to act 2216.

At 2218, a top electrode layer is formed over the data storage element. FIG. 17 illustrates a cross-sectional view 1700 of some embodiments corresponding to act 2218.

At 2220, the top electrode layer is selectively patterned to define a top electrode. FIG. 18 illustrates a cross-sectional view 1800 of some embodiments corresponding to act 2220.

At 2222, sidewall spacers are formed on opposing sides of the top electrode. FIG. 19 illustrates a cross-sectional view 1900 of some embodiments corresponding to act 2222.

At 2224, the data storage element, the bottom electrode layer, the reactivity reducing coating, and the bottom electrode diffusion barrier layer are selectively patterned to respectively define a data storage layer, a bottom electrode, a reactivity reducing layer, and a bottom electrode diffusion barrier. FIG. 19 illustrates a cross-sectional view 1900 of some embodiments corresponding to act 2224.

At 2226, an upper ILD layer is formed over the top electrode. FIG. 20 illustrates a cross-sectional view 2000 of some embodiments corresponding to act 2226.

At 2228, an upper interconnect structure is formed onto the top electrode. FIG. 21 illustrates a cross-sectional view 2100 of some embodiments corresponding to act 2228.

Although the disclosed figures and description are described in relation to resistive random access memory (RRAM) devices, it will be appreciated that the disclosed reactivity reducing layer is not limited to such memory devices. Rather, in some alternative embodiments, the disclosed reactivity reducing layer may also be applied to other types of memory devices, such as, but not limited to phase change random access memory (PCRAM), magnetoresistive random access memory (MRAM), ferroelectric random access memory (FRAM), programmable metallization memory, carbon nanotube memory, or the like.

Accordingly, in some embodiments, the present disclosure relates to an integrated chip comprising an RRAM device having a bottom electrode over a reactivity reducing layer that is configured to reduce a reactivity of the bottom electrode with oxygen. By reducing a reactivity of the bottom electrode with oxygen, the reactivity reducing layer improves a reliability (e.g., a number of read and/or write cycles that can be reliably performed) of the RRAM device.

In some embodiments, the present disclosure relates to an integrated chip. The integrated chip includes one or more lower interconnect layers arranged within a dielectric structure over a substrate; a bottom electrode disposed over one of the one or more lower interconnect layers, a lower surface of the bottom electrode including a material having a first electronegativity; a data storage layer separating the bottom electrode from a top electrode; and a reactivity reducing layer contacting the lower surface of the bottom electrode and having a second electronegativity that is greater than or equal to the first electronegativity. In some embodiments, the integrated chip further includes a bottom electrode diffusion barrier arranged between the reactivity reducing layer and the one or more lower interconnect layers. In some embodiments, the integrated chip further includes a lower insulating layer arranged on the dielectric structure and having sidewalls defining an opening directly below the bottom electrode, the lower insulating layer surrounding the reactivity reducing layer. In some embodiments, the integrated chip further includes one or more additional materials disposed between the reactivity reducing layer and an immediately underlying interconnect wire. In some embodiments, the second electronegativity is greater than approximately 2.2. In some embodiments, the lower surface of the bottom electrode includes a noble metal. In some embodiments, the first electronegativity is less than the second electronegativity. In some embodiments, the reactivity reducing layer has sidewalls that are aligned along a line with sidewalls of the bottom electrode. In some embodiments, the reactivity reducing layer includes a metal, a metal-nitride, a metal-oxide, or doped polysilicon. In some embodiments, the reactivity reducing layer includes aluminum, titanium, tantalum, tungsten, gold, platinum, nickel, iridium, titanium-nitride, tantalum-nitride, iridium oxide, n-type doped polysilicon, or p-type doped polysilicon.

In other embodiments, the present disclosure relates to an integrated chip. The integrated chip includes a lower insulating layer arranged over one or more inter-level dielectric (ILD) layers, the lower insulating layer having sidewalls defining an opening directly over one or more interconnect layers surrounded by the one or more ILD layers; a bottom electrode diffusion barrier disposed within the opening; a bottom electrode over the bottom electrode diffusion barrier and having a first electronegativity; a data storage layer separating the bottom electrode from a top electrode; and a reactivity reducing layer disposed directly between the bottom electrode diffusion barrier and the bottom electrode, the reactivity reducing layer having a second electronegativity that is greater than the first electronegativity. In some embodiments, the reactivity reducing layer includes a metal-nitride or a metal-oxide. In some embodiments, the reactivity reducing layer covers an entirety of a lower surface of the bottom electrode. In some embodiments, the reactivity reducing layer is completely over the lower insulating layer. In some embodiments, the bottom electrode includes a noble metal continuously extending from the reactivity reducing layer to the data storage layer. In some embodiments, the reactivity reducing layer is not copper. In some embodiments, the bottom electrode consist of a noble metal.

In yet other embodiments, the present disclosure relates to a method of forming an integrated chip. The method includes forming a reactivity reducing coating over one or more lower interconnect layers disposed over a substrate; forming a bottom electrode layer on and in contact with the reactivity reducing coating, the bottom electrode layer having a first electronegativity that is less than or equal to a second electronegativity of the reactivity reducing coating; forming a data storage element over the bottom electrode layer; forming a top electrode layer over the data storage element; and patterning the top electrode layer, the data storage element, the reactivity reducing coating, and the bottom electrode layer to define a memory device. In some embodiments, the method further includes forming a bottom electrode diffusion barrier layer over the one or more lower interconnect layers; and forming the reactivity reducing coating onto the bottom electrode diffusion barrier layer. In some embodiments, the method further includes forming a lower insulating layer over a dielectric structure surrounding the one or more lower interconnect layers; and patterning the lower insulating layer to form sidewalls of the lower insulating layer that define an opening directly below the bottom electrode layer, the reactivity reducing coating having a bottommost surface that is over a bottommost surface of the lower insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a bottom electrode disposed over a substrate and comprising a material having a first electronegativity, wherein the bottom electrode is disposed directly over a first interconnect that is a closest underlying interconnect to the bottom electrode;
a data storage layer separating the bottom electrode from a top electrode;
a reactivity reducing layer between the first interconnect and the bottom electrode, wherein the reactivity reducing layer has a second electronegativity that is greater than or equal to the first electronegativity; and
one or more additional materials disposed between the reactivity reducing layer and the first interconnect, wherein the reactivity reducing layer comprises a second material that is between the first interconnect and the bottom electrode and that has the second electronegativity.

2. The integrated chip of claim 1, wherein the second material of the reactivity reducing layer defines a top surface of the reactivity reducing layer that completely covers a bottommost surface of the bottom electrode.

3. An integrated chip, comprising:
one or more lower interconnect layers arranged within a dielectric structure over a substrate;
a bottom electrode disposed over one of the one or more lower interconnect layers, wherein a lower surface of the bottom electrode comprises a first material having a first electronegativity;
a data storage layer separating the bottom electrode from a top electrode;
a reactivity reducing layer comprising a second material contacting the lower surface of the bottom electrode and having a second electronegativity that is greater than or equal to the first electronegativity; and
a lower insulating layer arranged on the dielectric structure and comprising sidewalls defining an opening directly below the bottom electrode, wherein a horizontal plane that is parallel to an upper surface of the substrate extends through sidewalls of the lower insulating layer and the reactivity reducing layer.

4. The integrated chip of claim 3, wherein the second material is aluminum, titanium, tantalum, tungsten, gold, platinum, nickel, iridium, titanium-nitride, tantalum-nitride, iridium oxide, n-type doped polysilicon, or p-type doped polysilicon.

5. The integrated chip of claim 3, further comprising:
a bottom electrode diffusion barrier arranged between the reactivity reducing layer and the one or more lower interconnect layers.

6. The integrated chip of claim 3, wherein the reactivity reducing layer comprises sidewalls that are oriented at an angle greater than 90 degrees with respect to a top surface of the lower insulating layer.

7. The integrated chip of claim 3, wherein the second material is a metal, a metal-nitride, a metal-oxide, or doped polysilicon.

8. The integrated chip of claim 3, wherein the second electronegativity is greater than approximately 2.2.

9. The integrated chip of claim 3, wherein the first electronegativity is less than the second electronegativity.

10. The integrated chip of claim 3, wherein the first material is a noble metal.

11. The integrated chip of claim 3, further comprising:
one or more additional materials disposed between the reactivity reducing layer and an immediately underlying interconnect wire of the one or more lower interconnect layers.

12. The integrated chip of claim 11,
wherein the one or more additional materials comprise one or more different materials than the reactivity reducing layer; and
wherein the one or more additional materials comprise a metal, a metal-nitride, a metal-oxide, or doped polysilicon.

13. An integrated chip, comprising:
a lower insulating layer arranged over one or more inter-level dielectric (ILD) layers, wherein the lower insulating layer comprises sidewalls defining an opening directly over one or more interconnect layers surrounded by the one or more ILD layers;
a bottom electrode diffusion barrier disposed within the opening;
a bottom electrode over the bottom electrode diffusion barrier and comprising a first material having a first electronegativity;
a data storage layer separating the bottom electrode from a top electrode; and
a reactivity reducing layer comprising a second material that is disposed directly between the bottom electrode diffusion barrier and the bottom electrode, wherein the second material has a second electronegativity that is greater than the first electronegativity.

14. The integrated chip of claim 13, further comprising: one or more additional materials disposed between a lower surface of the reactivity reducing layer and an upper surface of a closest underlying interconnect wire of the one or more interconnect layers.

15. The integrated chip of claim 13, wherein the bottom electrode diffusion barrier and the reactivity reducing layer both contact a lower surface of the bottom electrode.

16. The integrated chip of claim 13, wherein the bottom electrode comprises a noble metal continuously extending from the reactivity reducing layer to the data storage layer.

17. The integrated chip of claim 13, wherein the second material of the reactivity reducing layer comprises a metal-nitride or a metal-oxide.

18. The integrated chip of claim 13, wherein the bottom electrode diffusion barrier comprises curved sidewalls.

19. The integrated chip of claim 13, wherein the reactivity reducing layer covers an entirety of a lower surface of the bottom electrode.

20. The integrated chip of claim 19, wherein the reactivity reducing layer is completely over the lower insulating layer.

* * * * *